(12) United States Patent
Whetsel

(10) Patent No.: US 8,615,694 B2
(45) Date of Patent: Dec. 24, 2013

(54) INTERPOSER TAP BOUNDARY REGISTER COUPLING STACKED DIE FUNCTIONAL INPUT/OUTPUT DATA

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/362,717

(22) Filed: Jan. 31, 2012

(65) Prior Publication Data

US 2012/0204073 A1 Aug. 9, 2012

Related U.S. Application Data

(60) Provisional application No. 61/440,125, filed on Feb. 7, 2011.

(51) Int. Cl.
*G01R 31/28* (2006.01)
(52) U.S. Cl.
USPC ............................... 714/727; 714/734
(58) Field of Classification Search
USPC .................. 714/724, 726, 727, 729, 733, 734
See application file for complete search history.

(56) References Cited

U.S. PATENT DOCUMENTS

| | | | |
|---|---|---|---|
| 7,518,398 B1* | 4/2009 | Rahman et al. .................. | 326/38 |
| 2011/0006794 A1* | 1/2011 | Sellathamby et al. ... | 324/754.03 |
| 2011/0108888 A1* | 5/2011 | Or-Bach et al. ............... | 257/204 |
| 2011/0148456 A1* | 6/2011 | Mooyman-Beck et al. ......................... | 324/762.02 |
| 2012/0204073 A1* | 8/2012 | Whetsel ........................ | 714/727 |
| 2012/0278674 A1* | 11/2012 | Whetsel ........................ | 714/727 |

OTHER PUBLICATIONS

Shin-Yi Huang; Tao-Chih Chang; Ren-Shin Cheng; Jing-Yao Chang; Chia-Wen Fan; Chau-Jie Zhan; Lau, J.H.; Tai-Hong Chen; Wei-Chung Lo; Ming-Jer Kao; , "Failure mechanism of 20 µm pitch microjoint within a chip stacking architecture," Electronic Components and Technology Conference (ECTC), 2011 IEEE 61st , vol., no., pp. 886-892, May 31, 2011-Jun. 3, 2011.*
Shin-Yi Huang; Tao-Chih Chang; Ren-Shin Cheng; Jing-Yao Chang; Fang-Jun Leu; Yu-Lan Lu; Tsung-Fu Yang; , "Reliability assessment of the 20 um pitch micro-joints within a 3DIC assembly under various environments," Microsystems Packaging Assembly and Circuits Technology Conference (IMPACT), 2010 5th International , vol., no., pp. 1-4, Oct. 20-22, 2010.*
Tao-Chih Chang; Ren-Shin Cheng; Kuo-Shu Kao; Wei Li; Ching-Kuan Lee; Jing-Yao Chang; Shin-Yi Huang; Chia-Wen Fan; Yin-Po Hung; Yu-Wei Huang; Yu-Min Lin; Tai-Hong Chen; Fang-Jun Leu; Su-Yu Fun; Wei-Chung Lo; , "Reliable microjoints for chip stacking formed by solid-liquid interdiffusion (SLID) bonding," Microsystems, Packaging, Assembly and Circuits.*

* cited by examiner

*Primary Examiner* — Cynthia Britt
(74) *Attorney, Agent, or Firm* — Lawrence J. Bassuk; Wade J. Brady, III; Frederick J. Telecky, Jr.

(57) ABSTRACT

The disclosure describes a novel method and apparatus for improving interposers that connected stacked die assemblies to system substrates. The improvement includes the addition of IEEE 1149.1 circuitry within interposers to allow simplifying interconnect testing of digital and analog signal connections between the interposer and system substrate it is attached too. The improvement also includes the additional 1149.1 controlled circuitry that allows real time monitoring of voltage supply and ground buses in the interposer. The improvement also includes the additional of 1149.1 controlled circuitry that allows real time monitoring of functional digital and analog input and output signals in the interposer. The improvement also provides the ability to selectively serially link the 1149.1 circuitry in the interposer with 1149.1 circuitry in the die of the stack.

3 Claims, 28 Drawing Sheets

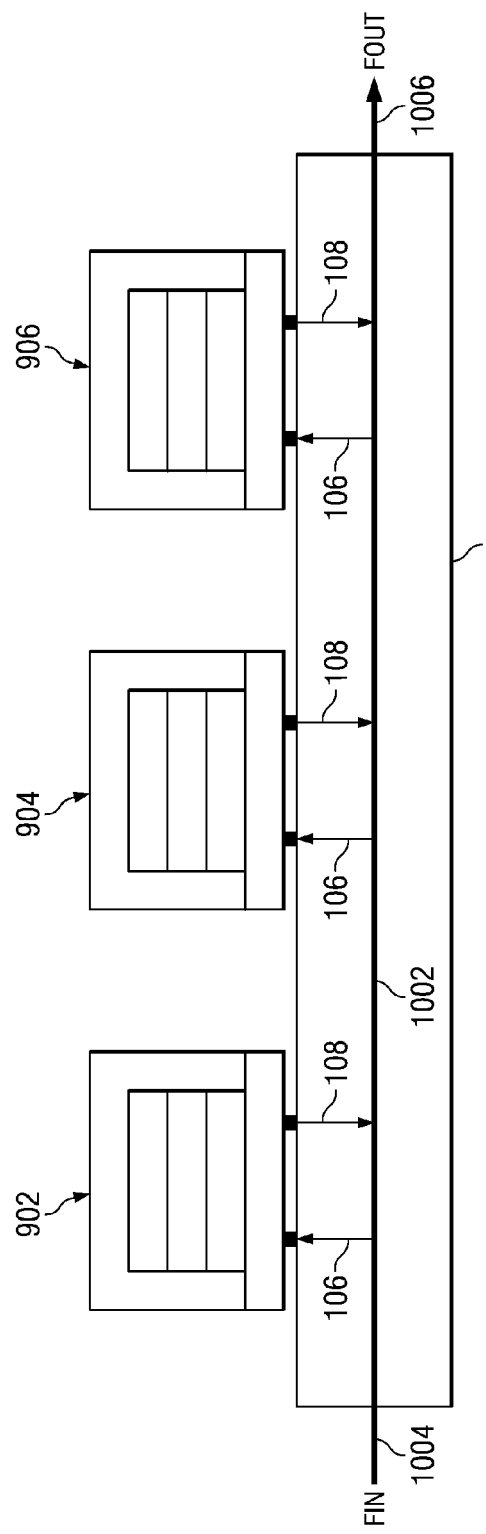
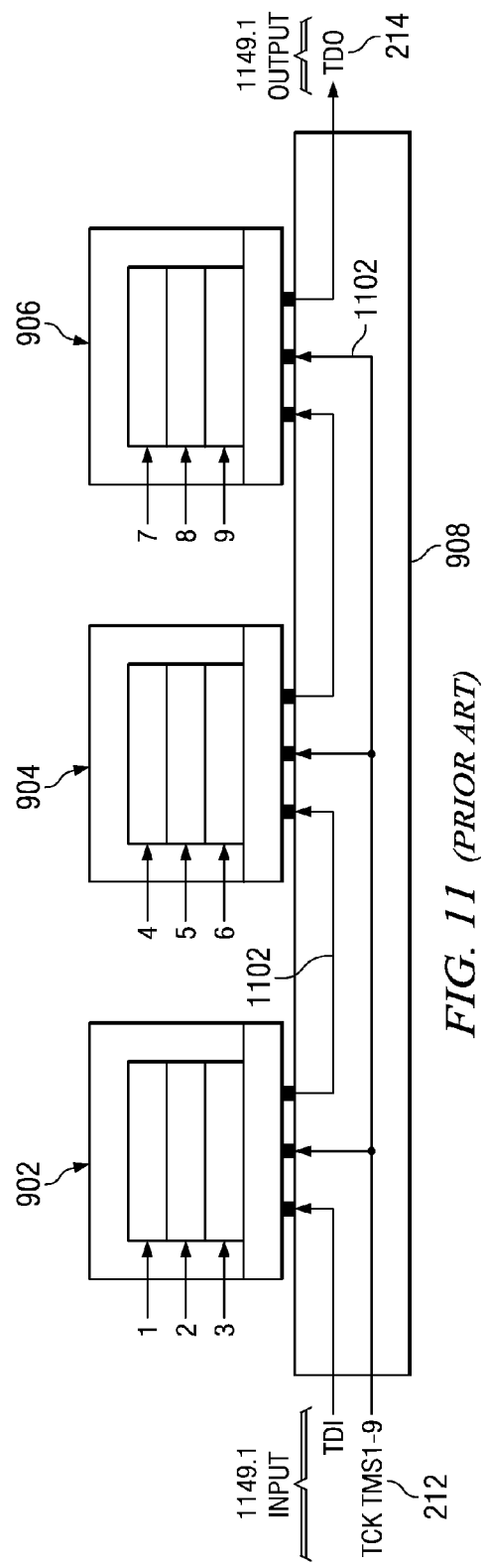

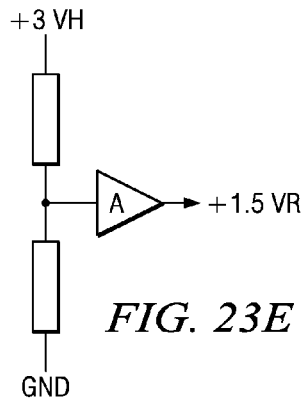
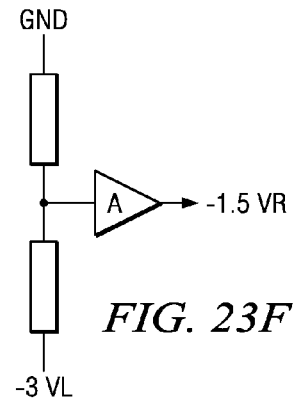
FIG. 23D　　　　FIG. 23E　　　　FIG. 23F
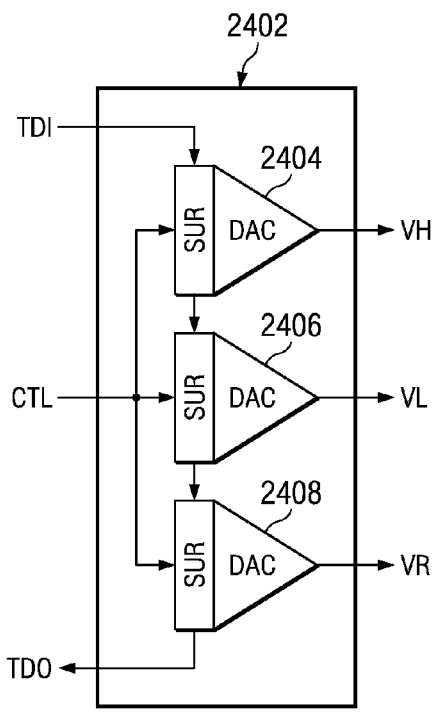
FIG. 24
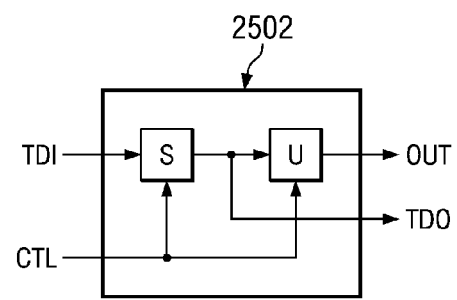
FIG. 25

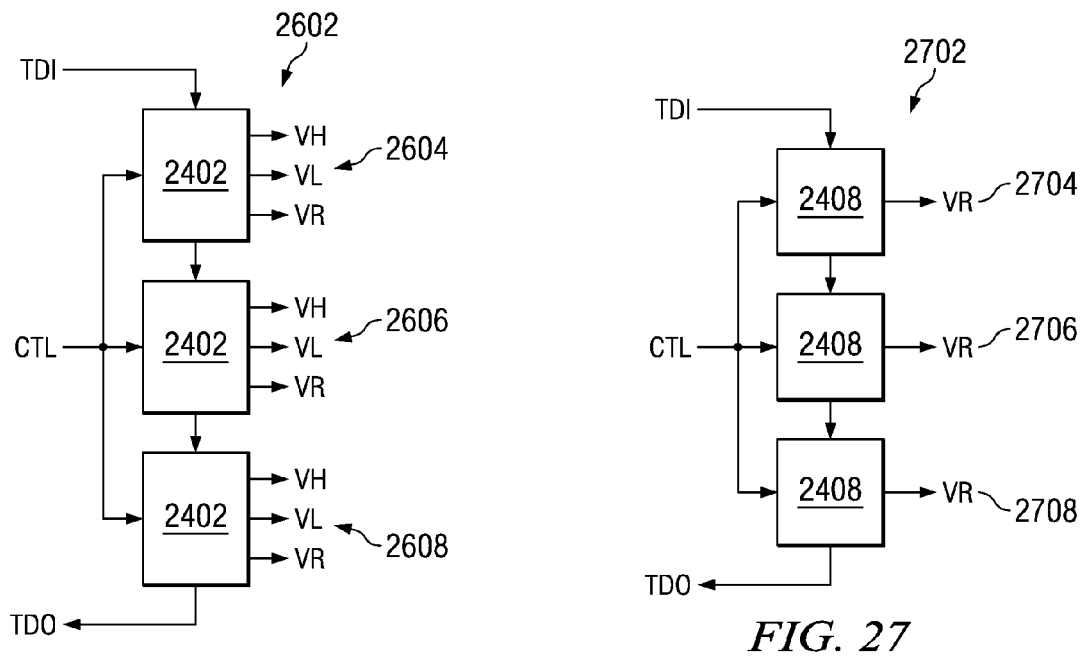
FIG. 26
FIG. 27
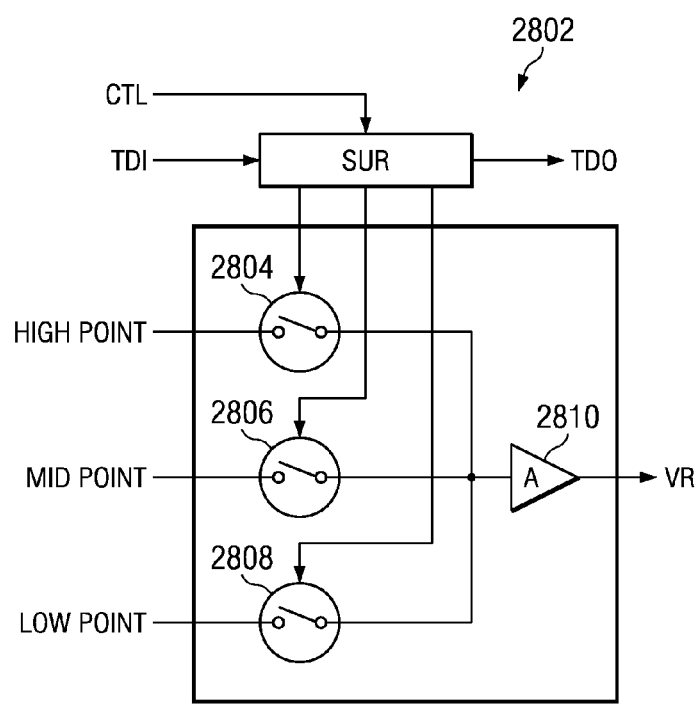
FIG. 28

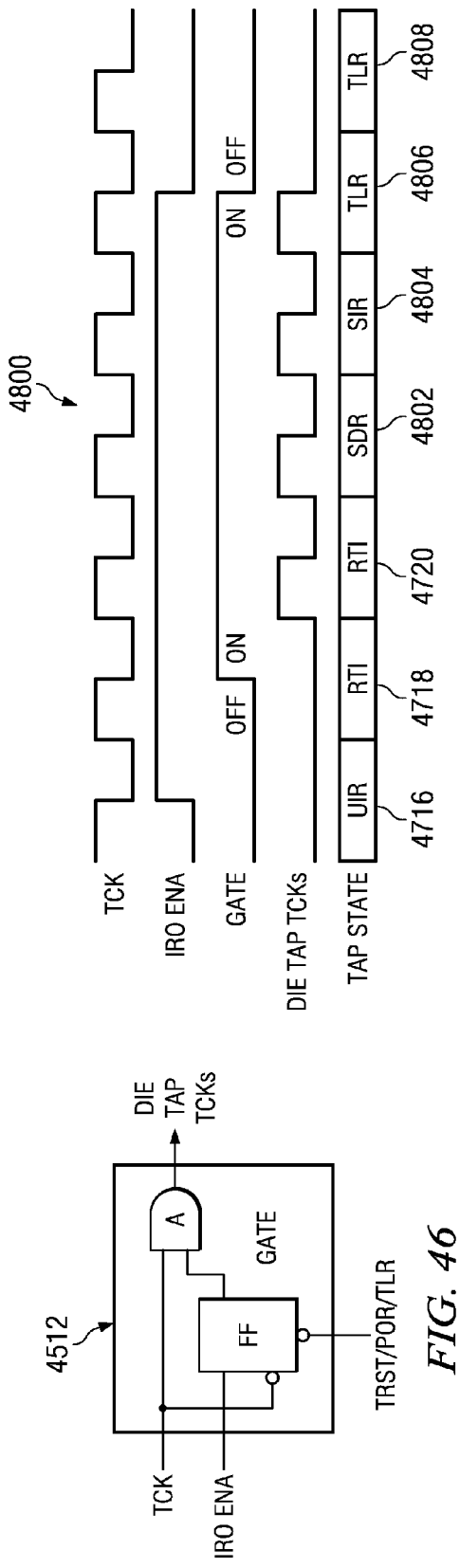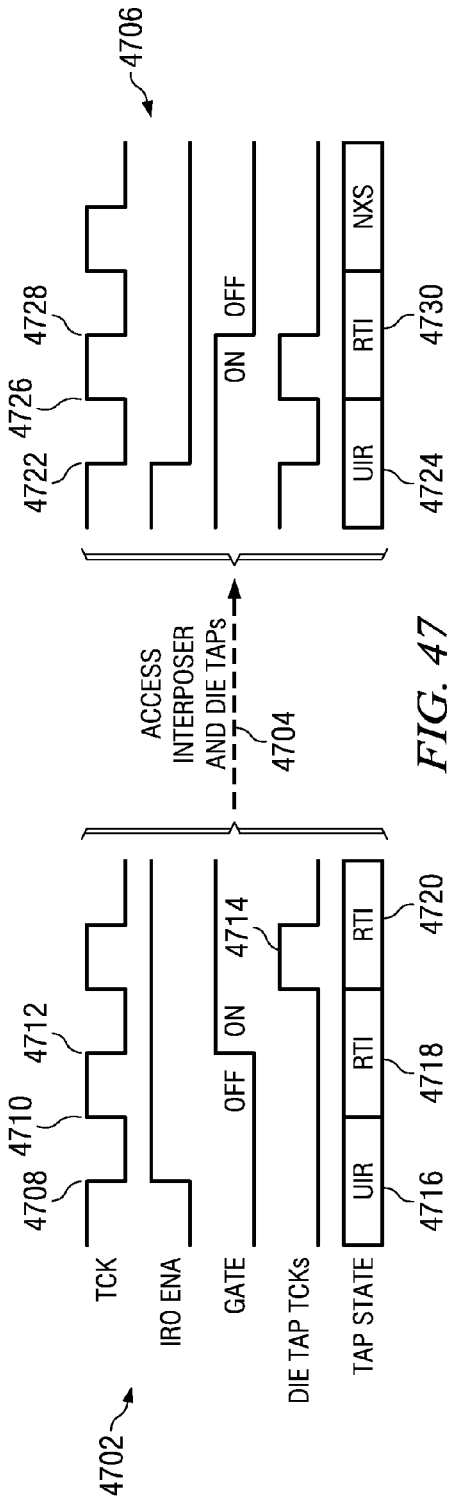
FIG. 46
FIG. 47
FIG. 48 ature, trace and emulation of embedded core circuits within the ICs. However, 1149.1 is not widely used in memory, analog and mixed signal ICs due to the above mentioned increase in package size and decrease in input and output performance. Memories in particular are resistant to using 1149.1 due to JDEC's memory pin out standardization.

INTERPOSER TAP BOUNDARY REGISTER COUPLING STACKED DIE FUNCTIONAL INPUT/OUTPUT DATA

This application claims priority from Provisional Application No. 61/440,125, filed Feb. 7, 2011.

FIELD OF THE DISCLOSURE

This disclosure relates generally to IEEE standard 1149.1 and in particular to the implementation of IEEE standard 1149.1 within interposers.

BACKGROUND OF THE DISCLOSURE

Integrated circuits (ICs) may be designed to include or not include IEEE 1149.1 boundary scan circuitry and interface. The benefits of including 1149.1 in an IC include but are not limited to; (1) boundary scan testing of interconnects between ICs on a substrate, (2) testing of the IC, (3) debugging circuits within the IC and (4) programming circuits within the IC. The drawbacks of including 1149.1 in an IC include; (1) the requirement of a dedicated 4 pin test interface which increases the IC package size and a timing penalty on the ICs inputs and outputs due to the boundary scan cell multiplexers. Most large digital ICs, such as CPUs, DSPs and ASICs, include 1149.1 for boundary scan testing and even more importantly to enable debug, trace and emulation of embedded core circuits within the ICs. However, 1149.1 is not widely used in memory, analog and mixed signal ICs due to the above mentioned increase in package size and decrease in input and output performance. Memories in particular are resistant to using 1149.1 due to JDEC's memory pin out standardization.

FIG. 1 illustrates an example integrated circuit die 102 that includes a functional circuit 104 that has external functional inputs (FIN) 106 and external functional outputs (FOUT) 108. Circuit 104 may have bidirectional signals as well, but for simplicity only inputs and outputs are discussed in this disclosure. The circuit 104 may be a digital, analog or mixed signal circuit that performs the functional operation of the die. Circuit 104 may also be a memory circuit, such as but not limited to a double data rate random access memory. As can be seen the die of FIG. 1 does not include 1149.1 boundary scan circuitry.

FIG. 2 illustrates an example integrated circuit die that includes a functional circuit 104 and 1149.1 circuitry consisting of a test access port (TAP) 204 and associated boundary register (BREG) 206. The TAP has an external interface of TDI, TCK, TMS inputs 212 and a TDO output 214 signals. The TAP responds to the TCK and TMS signals to input data from TDI and output data to TDO. If the boundary register is selected for access it will shift data from TDI to TDO. During normal operation of the die, the boundary register couples the FIN signals 106 to the internal inputs 208 of the circuit and the internal outputs 210 of the circuit to the FOUT signals 108. During boundary scan test mode using the well known 1149.1 Extest instruction, the boundary register isolates the FIN signals 106 from the internal inputs 208 and the internal outputs 210 from the FOUT signals 108. In the boundary scan test mode the boundary register can be operated to capture test data from the FIN signals 106 and update test data to the FOUT signals 108. The boundary scan test mode enables the testing of the FIN and FOUT connections between multiple die/ICs on a substrate.

FIG. 3 illustrates the TAP 204 of die 202 in more detail. The FIN signals 106 and the 1149.1 input signals 212 define the inputs 318 to the die. The FOUT signals 108 and the 1149.1 output signal 214 define the outputs 320 of the die. The 1149.1 TAP includes, at minimum, a TAP state machine (TSM) 304, an instruction register 306, a Bypass Register 308, the Boundary Register 206 and TDO output multiplexers 310 and 312. While not shown, the TAP may also include other data register between TDI and TDO, including an optional Identification Register which contains a 32 bit code identifying the die. During functional operation, the FIN signals 106 and FOUT outputs signals 108 are coupled to the circuit 104 via the boundary register 206 and buses 208 and 210. The TSM 304 operates according to the well known 16 state transition diagram of FIG. 3A in response to the TCK and TMS input signals to; (1) place the TAP is a Test Logic Reset state, (2) place the TAP in a Run Test/Idle state, (3) perform a scan operation to the instruction register from TDI to TDO, (4) to perform a data scan operation to the Bypass Register 308 from TDI to TDO or (4) perform a data scan operation to the Boundary Register 206 from TDI to TDO. The 1149.1 input interface 212 may include an optional TRST input, shown in dotted line, to reset the TSM and other TAP circuits. If the TRST input is not included, a Power Up Reset (POR) circuit 316 may be used to reset the TSM and other TAP circuits.

During instruction scan operations, the TSM outputs control (CTL) signals to the instruction register 306 and multiplexer 312. In response to the CTL signals the instruction register performs capture, shift and update operations. During the shift operation the instruction register shifts data from TDI to TDO via multiplexer 312.

During data scan operations, the TSM outputs CTL signals to the selected data register 308 or 206 and multiplexer 312. The instruction register output (IRO) bus enables the selected data register and controls multiplexer 310 to couple the TDO output of the selected data register to the TDO output of the die via multiplexer 312. In response to the CTL signals the selected data register performs capture, shift and update operations, except for the Bypass Register 308 which does not have update circuitry. During the shift operation the selected data register shifts data from TDI to TDO via multiplexers 310 and 312.

During manufacturing test of die 202, the inputs 318 and outputs 320 are connected to a tester. The tester operates the inputs 318 and outputs 320 to test the circuit 104 within the die 202. The test may include operating only the FIN 106 and FOUT 108 signals, operating the FIN 106, FOUT 108 and 1149.1 input 212 output 214 signals, or operating only the 1149.1 input 212 and output 214 signals. After testing and found to be good, the die is ready for use within in a system.

FIG. 4 illustrates three die 402-406 connected to a system substrate 408 via their inputs 318 and outputs 320. The system of this and following examples could be any type of electronic system such as a computer system or a cell phone system. Each die contains a functional circuit 104 and a TAP 204 as shown in FIGS. 2 and 3. The functional circuits 104 of each die provide a different functional operation on the substrate.

FIG. 5 illustrates the circuits 104 of die 402-406 connected on the system substrate 408. The substrate provides a functional bussing path 502 that connects the FIN 106 and FOUT 108 signals of the die together to enable the die to communicate. The substrate has FIN signals 504 to allow it to input signals from an external device, such as a keyboard, and FOUT signals 506 to allow it to output signals to an external device, such as a display.

FIG. 6 illustrates the TAPs 204 of die 402-406 connected on the system substrate 408. The substrate provides a serial bussing path 602 that connects the TAPs 204 to externally accessible 1149.1 input 212 and 1149.1 output 214 signals. When an 1149.1 controller is connected to the external 1149.1 input and output signals, the TAPs can be serially accessed to perform test or other operations. One of the most important test operations the TAPs perform is the verification that the FIN 106 and FOUT 108 of each die are properly connected together via the substrate bussing path 502. This test operation is performed by loading Extest instructions into each TAP's instruction register then operating the boundary registers of each TAP to test the connectivity between each die's FIN 106 and FOUT 108 signals.

FIG. 7 illustrates a device 700 comprising three stacked die 702-706 mounted on a silicon interposer 708. Each die includes a circuit 104 and a TAP 204 as described in FIGS. 2 and 3. Again, each die circuit 104 will typically provide a different functional operation. Die 702 and 704 in this example are designed using through silicon vias (TSV) 710. TSVs are connectivity paths formed between the top and bottom surfaces of the die. TSVs allow input 318 and output 320 signals to flow vertically up and down the die stack. In addition to TSV input and output signal connections from the interposer, the die 702-704 are also connected together locally using input 712 and output 714 signal connections. Interposers 708 are used to provide electrical connections between one surface and another surface. The primary purpose of an interposer is to spread connections from fine pitch contact points on one surface to wider pitch contact points on another surface. In this example, the fine pitch contact points on the bottom surface of die 702 are spread to match the wider pitch contacts points of a system substrate device 700 will be mounted on. Once the device 700 is mounted on a substrate, it receives input signals 318 from the substrate and sources output signals 320 to the substrate.

Before device 700 is assembled, each die 702-704 and the interposer 708 are tested to insure the device is assembled with known good die and interposer. As mentioned in regard to FIG. 3 the test may performed by a tester operating some are all of the FIN 106 and FOUT 108 signals of buses 318 and 320, operating some are all of the FIN 106, FOUT 108, and the 1149.1 input 212 output 214 signals of buses 318 and 320, or operating only the 1149.1 input 212 and output 214 signals of buses 318 and 320.

FIG. 8 illustrate a first example arrangement of how the TAPs 204 of die 702-706 in device 700 may be accessed by a tester. In this example, interposer signal bussing path 802 provides the TDI and TCK inputs to all TAPs, interposer signal path 804 provides a TMS1 input to the TAP of die 702, interposer signal path 806 provides a TMS2 input to the TAP of die 704, interposer signal path 808 provides a TMS3 input to the TAP of die 706 and interposer signal path 810 provides the TDO outputs from all the TAPs. Having unique TMS1-3 inputs for each TAP allows enabling one TAP while the other TAPs are disabled. When disabled a TAP's TDO output is tri-stated to avoid contention on signal path 1206 with an enabled TAP's TDO output. This is commonly referred to as the 1149.1 Star mode of accessing TAPs. To access the TAP of die 702 for a test or other operation, the tester inputs TMS1, TDI and TCK signals to the TAP via busses 804 and 802, and receives TDO signals from the TAP via bus 810. To access the TAP of die 704 for a test or other operation, the tester inputs TMS2, TDI and TCK signals to the TAP via busses 806 and 802, and receives TDO signals from the TAP via bus 810. To access the TAP of die 706 for a test or other operation, the tester inputs TMS3, TDI and TCK signals to the TAP via busses 808 and 802, and receives TDO signals from the TAP via bus 810.

FIG. 9 illustrates three devices 902-906 connected to a system substrate 908 via their inputs 318 and outputs 320. Each device contains a stack of die 910 with TAPs and an interposer 708 as shown in FIGS. 7 and 8.

FIG. 10 illustrates the substrate providing a functional bussing path 1002 that connects the FIN 106 and FOUT 108 signals of the devices 902-906 together to enable them to communicate. The substrate has FIN signals 1004 to allow it to input signals from an external device, such as a keyboard, and FOUT signals 1006 to allow it to output signals to an external device, such as a display.

FIG. 11 illustrates the substrate providing an externally accessible 1149.1 signal bussing path 1102 to the TAPs of the devices 902-906. Assuming the devices are assembled as shown in FIG. 8, the 1149.1 bussing path 1102 would include 9 unique TMS signals. In this example, TMS signals 1-3 would be used to individually access one of the three TAPs of device 902, TMS signals 4-6 would be used to individually access one of the three TAPs of device 904 and TMS signals 7-9 would be used to individually access one of the three TAPs of device 906.

When an 1149.1 controller is connected to the externally accessible 1149.1 bussing path 1102, a selected TAP in device 902 is enabled by one of the TMS1-3 inputs, a selected TAP in device 904 is enabled by one of the TMS4-6 inputs and a selected TAP in device 906 is enabled by one of the TMS7-9 inputs so that they can be serially accessed from the external 1149.1 input bus 212 and 1149.1 output bus. After accessing this first group of serially connected device TAPs, the 1149.1 controller can select a second group of serially connected device TAPs for access using a different set of TMS signals, and so on. Accessing separate groups of device TAPs can be used for performing an 1149.1 Extest operation to verify that the FIN 106 and FOUT 108 signals of each device are properly connected together via the substrate bussing path 1002.

A first problem with the 1149.1 access approach of FIG. 11 is that the 1149.1 bus 1102 requires a large number of TMS signals that must be routed through the substrate and connected to the multiple TAPs of devices 902-906.

A second problem with the 1149.1 access approach of FIG. 11 is that standard 1149.1 controllers typically only provide a single TMS signal to support 1149.1 access approaches as shown in FIG. 6. 1149.1 access approaches like that shown in FIG. 11 would require modifying standard 1149.1 controllers to include and operate multiple TMS signals.

A third problem with the 1149.1 access approach of FIG. 11 is that Extest operations are encumbered by having to individually select different groups of device TAPs to access their boundary register to test the FIN 106 and FOUT 108 connections to the functional bus 1002 of the substrate 908.

A fourth problem is that Extest operations are lengthened due to having to shift test data through boundary register cells of the local inputs 712 and outputs 714 of each die in the device. For example, when the boundary register of the TAP of die 704 of FIG. 8 is being accessed during an Extest operation to test the die's FIN 106 and FOUT 108 connections to a substrate, the boundary register cells on the die's local inputs 712 and outputs 714 also have to be shifted which adds to the test time. Since the local inputs 712 and outputs 714 of each die were tested after the device was assembled, as mentioned in regard to FIG. 7, they do not need to be tested again when the device is mounted on the substrate. Only the device's FIN 106 and FOUT 108 connections to the substrate need to be tested.

FIG. 12 illustrate a second example arrangement of how the TAPs 204 of die 702-706 in device 700 may be accessed by a tester. In this example, interposer signal bussing path 1202 provides the TCK and TMS inputs to all TAPs, interposer signal path 1204 provides a TDI input to the TAP of die 702, a local signal path 1208 provides the TDO output of the TAP of die 702 to the TDI input of the TAP of die 704, a local signal path 1210 provides the TDO output of the TAP of die 704 to the TDI input of the TAP of die 706 and interposer signal path 1206 provides a TDO output from the TAP of die 706. In this arrangement all the die TAPs of a device are connected in a daisy-chain and can be serially accessed together by the tester.

FIG. 13 illustrates three devices 1302-1306 connected to a system substrate 1308 via their inputs 318 and outputs 320. Each device contains a stack of die 1310 with TAPs and an interposer 708 as shown in FIG. 12.

FIG. 14 illustrates the substrate providing a functional bussing path 1402 that connects the FIN 106 and FOUT 108 signals of the devices 1302-1306 together to enable them to communicate. The substrate has FIN signals 1404 to allow it to input signals from an external device, such as a keyboard, and FOUT signals 1406 to allow it to output signals to an external device, such as a display.

FIG. 15 illustrates the substrate providing an externally accessible 1149.1 signal bussing path 1502 to the TAPs of the devices 1302-1306. Assuming the devices are assembled as shown in FIG. 12, the 1149.1 bussing path 1102 would provide a serial path through all the device TAPs using a single TMS signal. Signal path 1504 in each device is provided to indicate the daisy-chaining of the device TAPs.

When an 1149.1 controller is connected to the externally accessible 1149.1 bussing path 1502, all TAPs in devices 1302-1306 can be serially accessed from the external 1149.1 input 212 to the external 1149.1 output 214.

A first problem with the 1149.1 access approach of FIG. 15 is that the IEEE 1149.1 standard has rules that support only one TAP in a device to be implemented in a system. For example a device should only have one TAP instruction register 306, one TAP bypass register 308, one optional TAP identification register and one TAP boundary register 206. As seen in FIG. 15, the system devices 1302-1306 each have multiple TAP instruction registers 306, multiple TAP bypass registers 308, multiple TAP boundary registers 206 and multiple optional TAP identification registers. Therefore the system devices 1302-1306 of FIG. 15 are considered to be non-compliant with the IEEE 1149.1 standard.

A second problem is that Extest operations are lengthened due to having to shift test data through boundary register cells of the local inputs 712 and outputs 714 of the die within each device. For example, when the boundary registers of the TAPs of the device of FIG. 12 are being accessed during an Extest operation to test the device's FIN 106 and FOUT 108 connections to the substrate of FIG. 15, the boundary register cells on the die's local inputs 712 and outputs 714 also have to be shifted which adds to the test time. Since the local inputs 712 and outputs 714 of each die were tested after the device was assembled, as mentioned in regard to FIG. 7, they do not need to be tested again when the device is mounted on the substrate. Only the device's FIN 106 and FOUT 108 connections to the substrate need to be tested.

The following disclosure provides a solution to the above mentioned problems of FIGS. 11 and 15. The solution is based on the concept of improving conventional interposers to include IEEE 1149.1 TAP circuitry.

BRIEF SUMMARY OF THE DISCLOSURE

This disclosure describes an interposer that is improved to include IEEE 1149.1 TAP circuitry. This 1149.1 equipped interposer can be substituted in stacked die application in place of conventional interposers to eliminate the problems identified in regard to FIGS. 11 and 15. Additional interposer improvements are also provided and described.

BRIEF DESCRIPTION OF THE VIEWS OF THE DRAWINGS

FIGS. 9-11 illustrate the functional and test substrate connections using multiple TMS signals.
FIGS. 23A-23F illustrate various voltage divider circuits with amplifiers that can be used in the interposer according to the disclosure.
FIG. 24 illustrates DAC controlled by a register connected to a TAP that can be used in the interposer according to the disclosure.
FIG. 25 illustrates a scan cell for building the DAC register of FIG. 24 that can be used in the interposer according to the disclosure.
FIG. 26 illustrate a first multiple DAC arrangement that can be used in the interposer according to the disclosure.
FIG. 27 illustrates a second multiple DAC arrangement that can be used in the interposer according to the disclosure.
FIG. 28 illustrates a switch controlled by a register connected to a TAP that can be used in the interposer according to the disclosure.

FIG. 46 illustrates circuit for gating TCK on and off according to the disclosure.

FIG. 47 illustrates the timing of gating TCK on, accessing die TAP(s) then gating TCK off according to the disclosure.

FIG. 48 illustrates the timing of gating TCK on, then moving the interposer and die TAPs to the Test Logic Reset state according to the disclosure.

DETAILED DESCRIPTION OF THE DISCLOSURE

Figure 1:
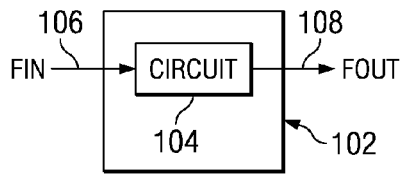
FIG. 1 illustrates an IC.
Figure 2:
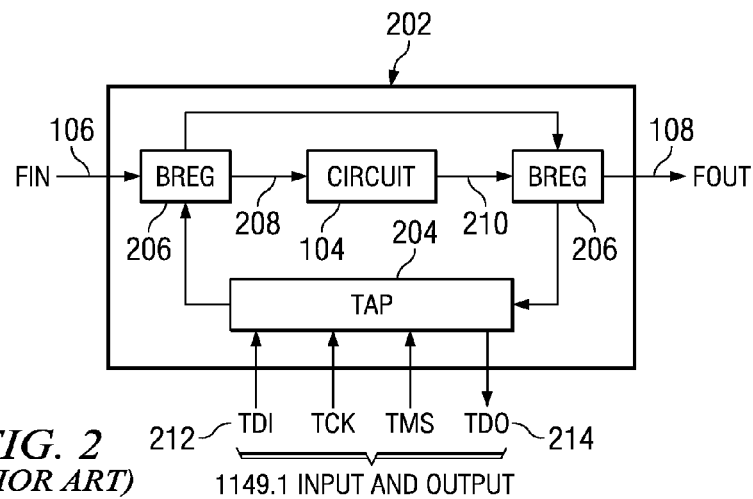
FIG. 2 illustrates an IC with 1149.1 TAP circuitry.
Figure 16:
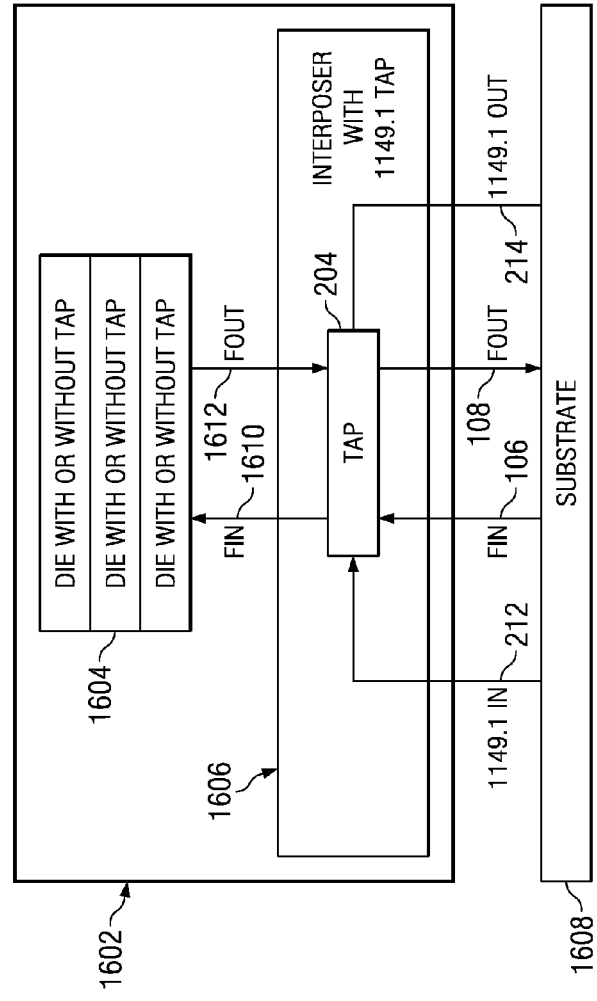
FIG. 16 illustrates an interposer and die stack according the disclosure.

FIG. 16 illustrates a device 1602 comprising stacked die 1604 and an interposer 1606, the interposer including an 1149.1 TAP 204. The die in the stack may or may not include an 1149.1 TAP, i.e. the die may be the FIG. 1 die 102, the FIG. 2 die 202 or a mixture of the FIG. 1 and FIG. 2 die. The 1149.1 interposer has external inputs for receiving 1149.1 input signals 212 and FIN signals 106 from a substrate 1608. The 1149.1 interposer has external outputs for outputting FOUT signals 108 and an 1149.1 output signal 214 to substrate 1608.

The 1149.1 interposer outputs FIN signals 1610 to the stacked die 1604 and inputs FOUT signals 1612 from the stacked die 1604.

Figure 17:
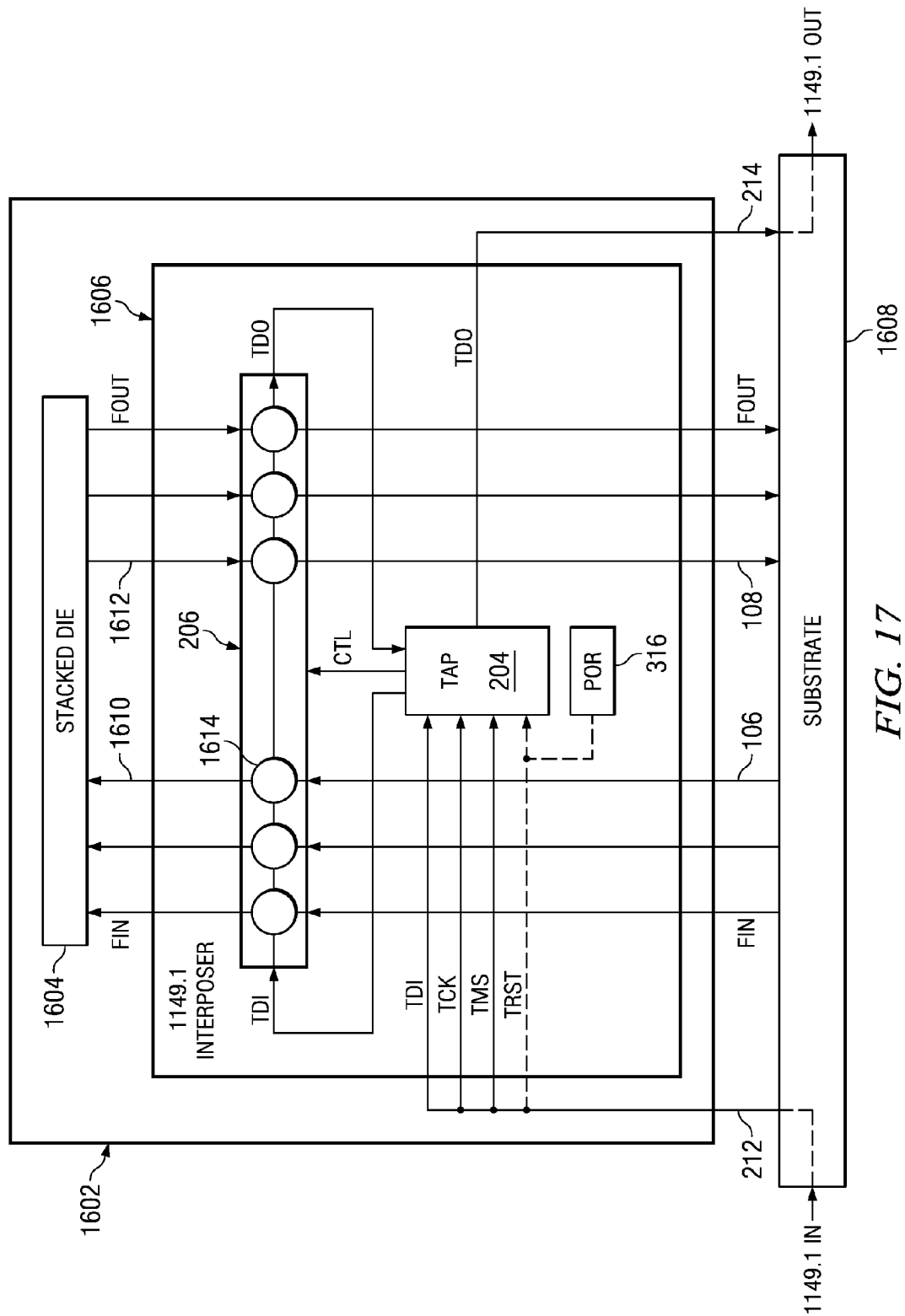
FIG. 17 illustrates a detail view of the interposer and die stack according the disclosure.

FIG. 17 illustrates the 1149.1 interposer 1606 of device 1602 in more detail. As seen the interposer includes a TAP 204 and boundary register 206 and an optional POR circuit 316. The boundary register 206 is composed of a series of boundary scan cells 1614 located between the TDI input and TDO output of the boundary register. The boundary register 206 receives CTL input from TAP 204 and is shown outside the TAP 204, as opposed to the view of TAP 204 in FIG. 3, to simplify the description of FIG. 17. The TAP 204 and boundary register 206 operate as described in regard to FIG. 3.

During functional operation, i.e. when the 1149.1 Bypass, Sample or IDcode instruction is loaded into the TAP's instruction register 306, the TAP's boundary register couples FIN signals 106 to FIN signals 1610 and FOUT signals 1612 to FOUT signals 108 via the boundary scan cells 1614.

During Extest operation, i.e. when the Extest instruction is loaded into the TAP's instruction register 306, the TAP's boundary register decouples FIN signals 106 from FIN signals 1610 and FOUT signals 1612 from FOUT signals 108 via the boundary scan cells 1614. While Extest is the current instruction, the TAP's boundary register can shift in and update test stimulus data on the FIN signals 1610 to the stacked die 1604 and on the FOUT signals 108 to the substrate 1608. Also during Extest operation, the TAP's boundary register can capture and shift out test response data from the FIN signals 106 from the substrate 1608 and FOUT signals 1612 from the stacked die 1604. The FIN and FOUT signals can be either digital signals or analog signals. Digital boundary scan cells 1614 are used on digital signals and analog boundary scan cells 1614 are used on analog signals.

Figure 18:
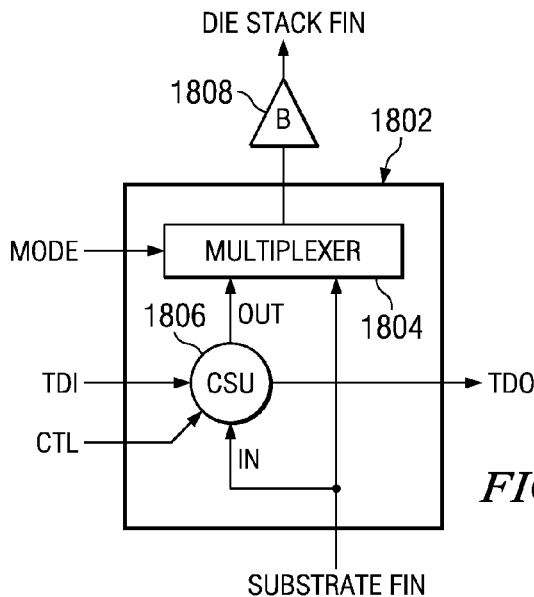
FIG. 18 illustrates a digital input boundary scan cell that can be used in the interposer according to the disclosure.

FIG. 18 illustrates a conventional example digital input boundary scan cell 1802 that can be used in the interposer's boundary register 206. The cell comprises a capture, shift and update (CSU) cell 1806 and a multiplexer 1804. The CSU cell inputs the TDI signal and the CTL signals from the TAP's TSM 304 of FIG. 3 and outputs a TDO signal and an output (OUT) signal to the multiplexer. The multiplexer inputs the OUT signal from the CSU cell, a digital input signal from the substrate, a Mode signal from the IRO of the TAP's instruction register 306 of FIG. 3, and outputs a digital input signal to the stacked die via a buffer 1808. If the multiplexer has sufficient drive for the input to the die stack, the buffer may be omitted.

During functional mode, the Mode signal is set to cause the multiplexer to pass the digital input signal from the substrate to the digital input signal of the die stack via the buffer. During Extest mode, the Mode signal is set to pass the OUT signal from the CSU cell to the digital input signal of the die stack via the buffer.

In either the functional or Extest mode, the CSU cell can be operated by the TAP to capture the digital input from the substrate and shift it out on TDO. The functional mode capture and shift operation is enabled when the IEEE 1149.1 "Sample" instruction is loaded into the TAP instruction register 306. The Extest mode capture and shift operation is enabled when the IEEE 1149.1 "Extest" instruction is loaded into the TAP instruction register 306.

Figure 19:
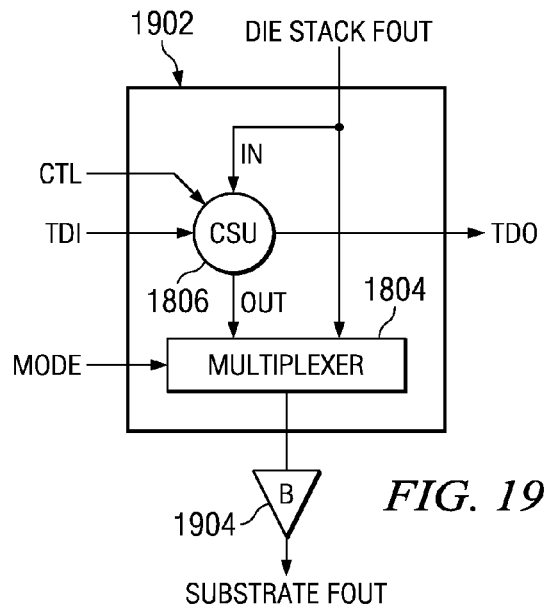
FIG. 19 illustrates a digital output boundary scan cell that can be used in the interposer according to the disclosure.

FIG. 19 illustrates a conventional digital output boundary scan cell 1902 comprising a CSU cell 1806 and multiplexer 1804. The structure and operation of the digital output boundary scan cell is identical to the digital input boundary scan cell of FIG. 18. The only differences are; (1) it inputs a digital input from the die stack instead of from the substrate and outputs a digital output to the substrate instead of the die stack and (2) it requires an output buffer 1904 on the output of the multiplexer since it must drive all the digital inputs of the devices it connects to on the substrate's functional bus.

Figure 20:
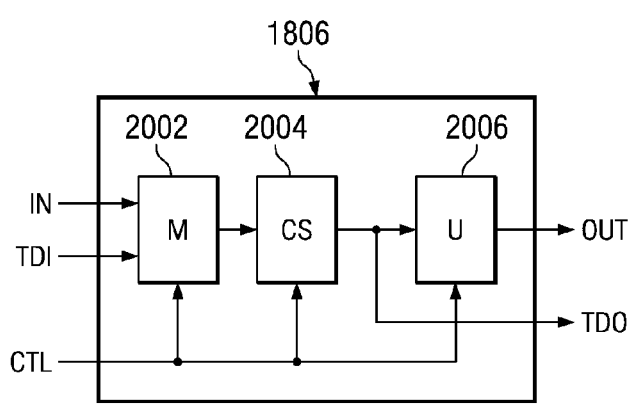
FIG. 20 illustrates a capture, shift and update scan cell that can be used in the interposer according to the disclosure.

FIG. 20 illustrates a known example implementation of the CSU cell 1806 of FIGS. 18 and 19. The CSU cell 1806 consists of a multiplexer (M) 2002, a capture and shift (CS) memory 2004, and an update memory (U) 2006, all connected as shown. During the capture operation, the CS memory 2004 is controlled by the CTL inputs from the TSM 304 of TAP 204 of FIG. 3 to capture data on the IN input of multiplexer 2002. During the shift operation, the CS memory 2004 is controlled by the CTL inputs from the TSM 304 of TAP 204 of FIG. 3 to shift data from the TDI input of multiplexer 2002 to the TDO output of the CS memory 2004. During the update operation, the update (U) memory 2006 is controlled by the CTL inputs from the TSM 304 of TAP 204 to update data from the CS memory 2004 to the OUT output of update memory (U) 2006. During each capture shift and update scan operation, data may be updated to the update (U) memory to change the logical output state of multiplexer 1804 or to maintain the logical output state of multiplexer 1804.

Figure 21:
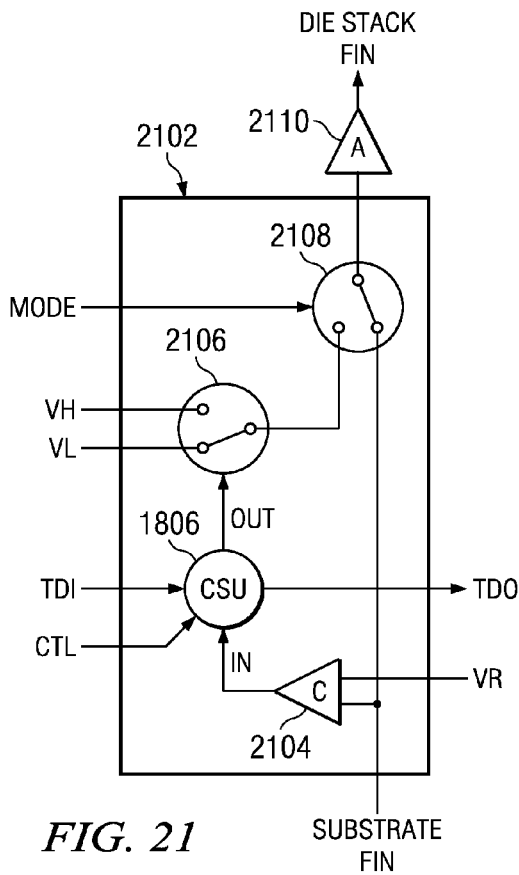
FIG. 21 illustrates an analog input boundary scan cell that can be used in the interposer according to the disclosure.

FIG. 21 illustrates an example analog input boundary scan cell 2102 of the present disclosure comprising a CSU cell 1806, comparator 2104 and analog switches 2106 and 2108 that could be used on analog input signals that pass through the interposer. The CSU inputs the TDI signal, the CTL signals from the TAP's TSM 304, a digital input (IN) from comparator 2104, and outputs the OUT signal to switch 2106 and the TDO signal. The comparator 2104 inputs an analog voltage signal, such as but not limited too, a sinusoidal signal or other time varying type of analog signal, from the substrate and a voltage reference (VR) level. Switch 2106 inputs the OUT signal from the CSU, a voltage low (VL) drive level, a voltage high (VH) drive level, and outputs a VL or VH level to switch 2108. Switch 2108 inputs the analog voltage signal from the substrate, the VH or VL drive level from switch 2106, the Mode signal from the IRO of the TAP's instruction register 306, and outputs a analog voltage signal to a unity gain voltage follower amplifier (A) 2110. Amplifier 2110 inputs the analog voltage signal from switch 2108, amplifies the drive strength of the analog voltage signal and outputs the amplified voltage signal to the die stack. The CSU cell 1806 operates as described in FIG. 18.

During functional mode, the Mode signal is set to cause switch 2108 to pass the analog voltage signal from the substrate to an analog voltage signal input of the die stack, via amplifier 2110.

During Extest mode, the Mode signal is set to cause switch 2108 to pass the VL or VH drive level from switch 2106 to the analog voltage signal input of the die stack, via amplifier 2110. The logic state of the OUT signal from the CSU cell 1806 determines whether switch 2106 outputs a VL or VH drive level to switch 2108. For example if OUT is low, a VL drive level may be output and if OUT is high, a VH drive level may be output. The logic level of the OUT signal from the CSU cell is updated during TAP controlled capture, shift and update scan operations. The OUT signal can be updated to cause switch 2106 to output a constant VL or VH signal to switch 2108 or to output alternating VL and VH signals to switch 2108.

In either the functional or Extest mode, the CSU cell can be operated by the TAP to capture a digitized version of the analog voltage input from the substrate, via the IN output from the comparator 2104, and shift it out on TDO. The VR level to the comparator is set to output a logic high on the IN input of the CSU cell when the analog voltage input from the substrate is above the VR level and to output a logic low on the IN input when the analog voltage input from the substrate is below the VR level. The functional mode capture and shift operation is enabled when the IEEE 1149.1 "Sample" instruction is loaded into the TAP instruction register 306. The Extest mode capture and shift operation is enabled when the IEEE 1149.1 "Extest" instruction is loaded into the TAP instruction register 306.

Figure 22:
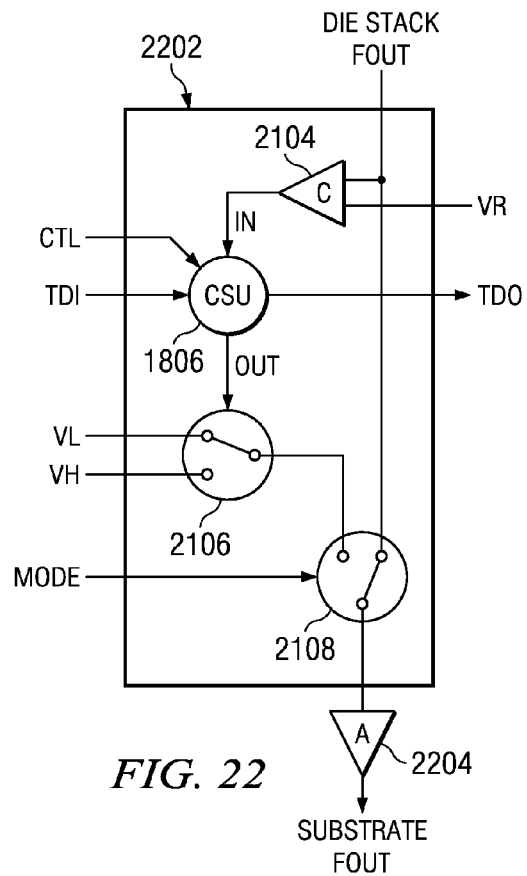
FIG. 22 illustrates analog output boundary scan cell that can be used in the interposer according to the disclosure.

FIG. 22 illustrates an example analog output boundary scan cell 2202 of the present disclosure comprising a CSU cell 1806, comparator 2104 and analog switches 2106 and 2108 that could be used on analog output signals that pass through the interposer. A unity gain voltage follower amplifier (A) 2204 is placed on the output of switch 2108 to amplify the drive strength of the analog voltage signal input to the substrate. The structure and operation of the analog output boundary scan cell is identical to the analog input boundary scan cell of FIG. 21. The only differences are; (1) it inputs an analog voltage signal from the die stack instead of from the substrate and outputs an analog voltage signal to the substrate instead of the die stack and (2) the output drive of the amplifier 2204 is greater than the output drive of the amplifier 2110 of FIG. 21 since it must drive all the analog inputs of the devices it connects to on the substrate.

Analog circuits in devices that communicate together via the analog boundary cells of the interposer's boundary register may communicate using different voltage ranges. For example, a first group of analog circuits may communicate through the cells using a voltage range of ground to +3 volts, a second group of analog circuits may communicate through the cells using a voltage range of ground to −3 volts, and a third group of analog circuits may communicate through the cells using a voltage range of −5 to +5 volts. If the supplies (+3, −3, +5 and −5) for these voltage ranges pass through the interposer, they can be tapped to provide the appropriate VL and VH drive levels for an associated group of analog boundary scan cells. A mid point voltage can be tapped, via a voltage divider between ground and +3V, to provide the VR for digitizing comparators 2104 in analog boundary scan cells on signal paths operating from ground to +3V. A mid point voltage can be tapped, via a voltage divider between ground and −3V, to provide the VR for digitizing comparators 2104 in analog boundary scan cells on signal paths operating from ground to −3V. Ground can be tapped to provide the VR for digitizing comparators 2105 in analog boundary scan cells on signal paths operating from −5V to +5V.

If the required voltage supplies above do not pass through the interposer, for example if only +10 and −10 supply voltage pass through the interposer, the lower level voltages −3, +3, −5, +5 and the associated VR's must be provided by circuitry in the interposer. This would be the case when die in the stack receive higher level voltages (i.e. the +10 and −10 supplies) and internally provide the lower level voltages using embedded voltage regulator circuits.

Figure 23A:
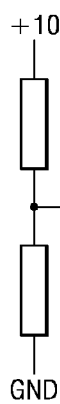
Figure 23B:
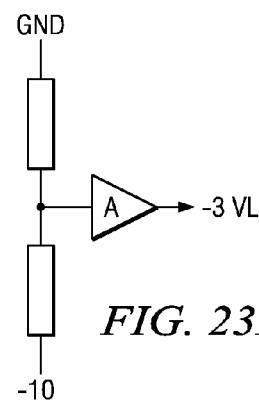
Figure 23C:
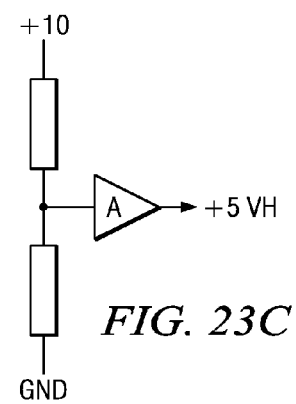

FIGS. 23A-23F illustrates voltage divider circuits that can be implemented in the interposer to provide the required voltages for the above mentioned first, second and third groups of analog boundary scan cells. Each circuit includes an appropriate resistive voltage divider and a voltage follower amplifier (A). FIG. 23A provides the +3V VH level, FIG. 23B provides the −3V VL level, FIG. 23C provides the +5V VH level, FIG. 23D provides the −5V VL level, FIG. 23E provides the midpoint +1.5V VR level and FIG. 23F provides midpoint −1.5V VR level.

FIG. 24 illustrates an alternate implementation 2402 for providing the VH, VL and VR levels to analog boundary scan cells in an interposer. The alternate implementation 2402 comprises digital to analog converters (DAC) and shift and update registers (SUR). The SURs have parallel outputs coupled to the parallel inputs of the DACs and a serial bus coupled to the TDI, CTL and TDO signals of the 1149.1 TAP. An example of a shift and update scan cell that could be used in the SUR is shown in FIG. 25. The scan cell responds to CTL input to shift data through a shift bit (S) from TDI and TDO and update the data from the shift bit (S) to the update bit (U) to be output to the DAC on the OUT signal. Multiple FIG. 25 scan cells are serially connected to realize the SUR. The 1149.1 serial bus can be operated to shift in and update the parallel outputs of the SURs to the parallel inputs of the DACs, causing the DACs to output a desired voltage level. In this example, DAC 2404 outputs a desired VH level, DAC 2406 outputs a desired VL level and DAC 2408 outputs a desired VR level. It is assumed that the DACs have sufficient output drive to where voltage follower amplifiers (A) are not required on the outputs of the DACs.

FIG. 26 illustrates an arrangement 2602 of three serially connected implementations 2402 providing three groups 2604-2608 of separate VH, VL and VR levels for each of the above mentioned first, second and third analog boundary scan cell groups. The advantage of arrangement 2602 over using the voltage dividers of FIGS. 23A-23F to provide the three groups of separate VH, VH and VR levels is that each of the voltage levels can be uniquely programmed by different values scanned into the SURs. In particular, being able to establish a DAC controlled variable VR to the digitizing comparator 2104 of the analog boundary scan cells is very useful. For example, using a fixed mid point VR provided by a voltage divider as shown in FIGS. 23E and 23F can test that an analog signal input crosses the mid point voltage, but it can't test the amplitude of the upper and lower swings of the analog signal. Using the DAC controlled variable VR of FIG. 24, the VR can be set to a mid point voltage to test that an analog signal transitions through at least the mid point voltage, then the VR can be set to a high point voltage to test that the analog signal transitions at least through the high point voltage and then the VR can be set to a low point voltage to test that the analog signal transitions at least through the low point voltage. Besides the mid point, high point, and low point voltages, any number of voltage levels, based on the resolution of the DAC, can be applied to the VR signal, which can aid in diagnosing analog signaling problems in systems. The variable VR mid, high and low threshold detection approach can be used to capture a digitized analog signal in a functionally operating system via the 1149.1 "Sample" instruction or it can be used to capture a digitized analog signal when the system is in an off-line test mode using the 1149.1 "Extest" instruction.

To reduce circuitry overhead, implementation 2402 may be simplified to only include the SUR and DAC combination 2408 to only provide the VR. The VH and VL levels of implementation 2402 can be provided using the simple voltage dividers of FIGS. 23A-23D. This would allow using simple fixed VH and VL drive levels in combination with the DAC programmable VR level to achieve the low, mid, high and other VR threshold points stated above.

FIG. 27 illustrates an arrangement 2702 of three serially connected SUR and DAC combinations 2408 providing three separately programmable VR levels 2704-2708 for each of the above mentioned first, second and third analog boundary scan cell groups.

FIG. 28 illustrates a simpler programmable level VR circuit 2802 that could be used to provide only the high, mid and low point VR levels mentioned above. The circuit includes a SUR, three analog switches 2804-2808 and a unity gain voltage follower amplifier (A) 2810. If the high point level is to be used as the VR, the SUR will be scanned with control to close switch 2804 and open switches 2806 and 2808. If the mid point level is to be used as the VR, the SUR will be scanned with control to close switch 2806 and open switches 2804 and 2808. If the low point level is to be used as the VR, the SUR will be scanned with control to close switch 2808 and open switches 2804 and 2806. This simpler programmable VR circuit 2802 could be used with fixed voltage divider VH and VL drive levels to further reduce circuitry overhead. Three serially connected programmable VR circuits 2802 could be arranged as in FIG. 27 to provide the low, mid and high point VR levels for the above mentioned first, second and third analog boundary scan cell groups.

Figure 29:
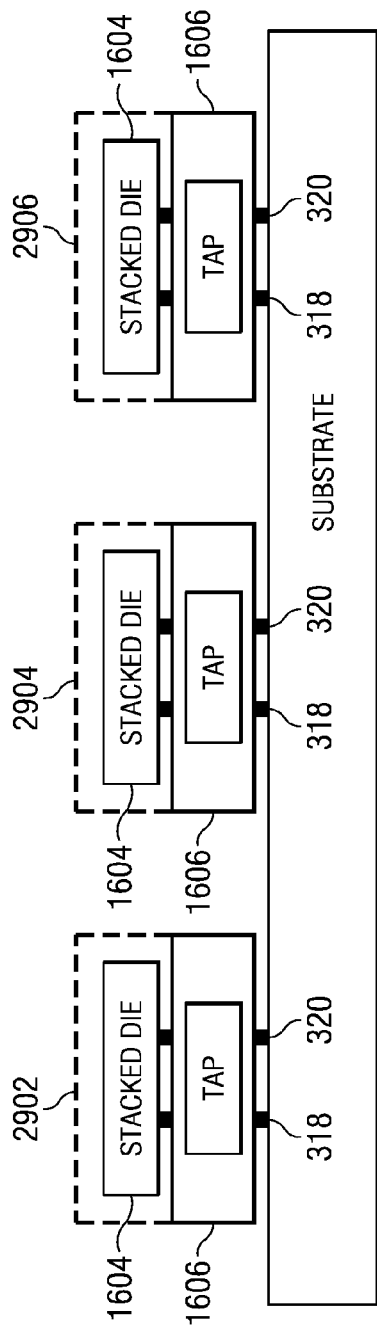
FIGS. 29-31 illustrate the functional and test substrate connections using the interposer of the present disclosure.

FIG. 29 illustrates three devices 2902-2906 connected to a system substrate 2908 via their inputs 318 and outputs 320. Each device contains a number of stacked die 1604 and an 1149.1 interposer 1606 as shown in FIG. 17.

Figure 30:
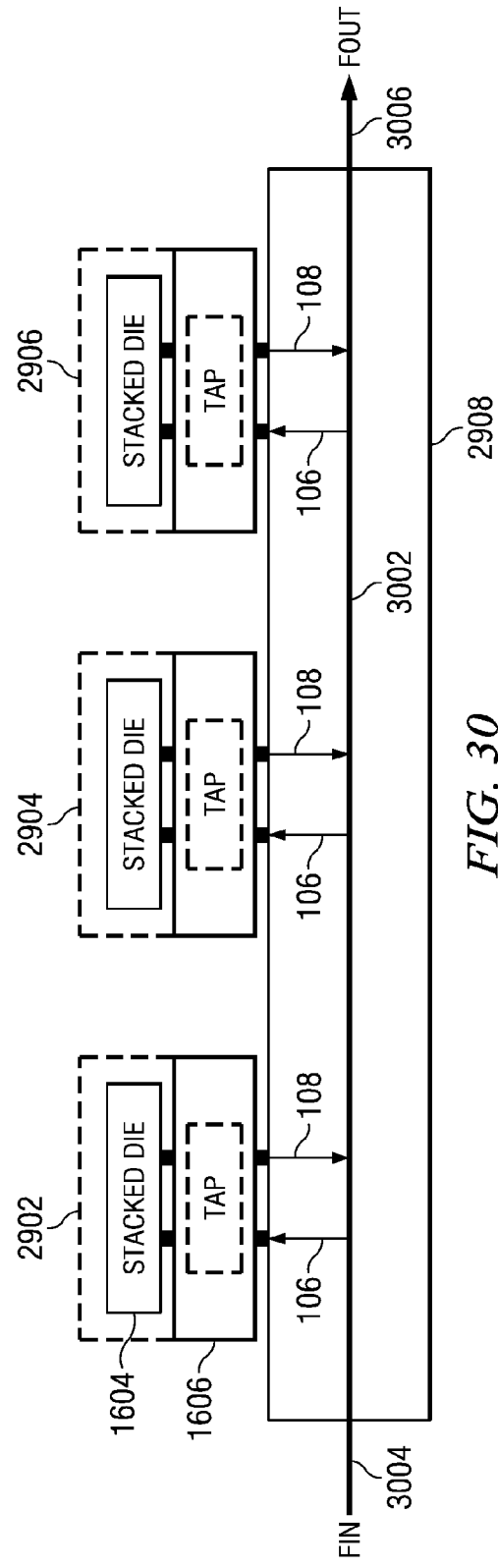

FIG. 30 illustrates the stacked die 1604 of devices 2902-2906 connected to the functional bussing path 3002 of the substrate via their FIN 106 and FOUT 108 signals to enable the devices to communicate. The substrate has FIN signals 3004 to allow it to input signals from an external device, such as a keyboard, and FOUT signals 3006 to allow it to output signals to an external device, such as a display. In this example, the boundary register 206 of the interposer TAP 204 is set to allow FIN and FOUT signals to flow freely through the interpose 1606, as indicated by the TAP being in dotted line.

Figure 31:
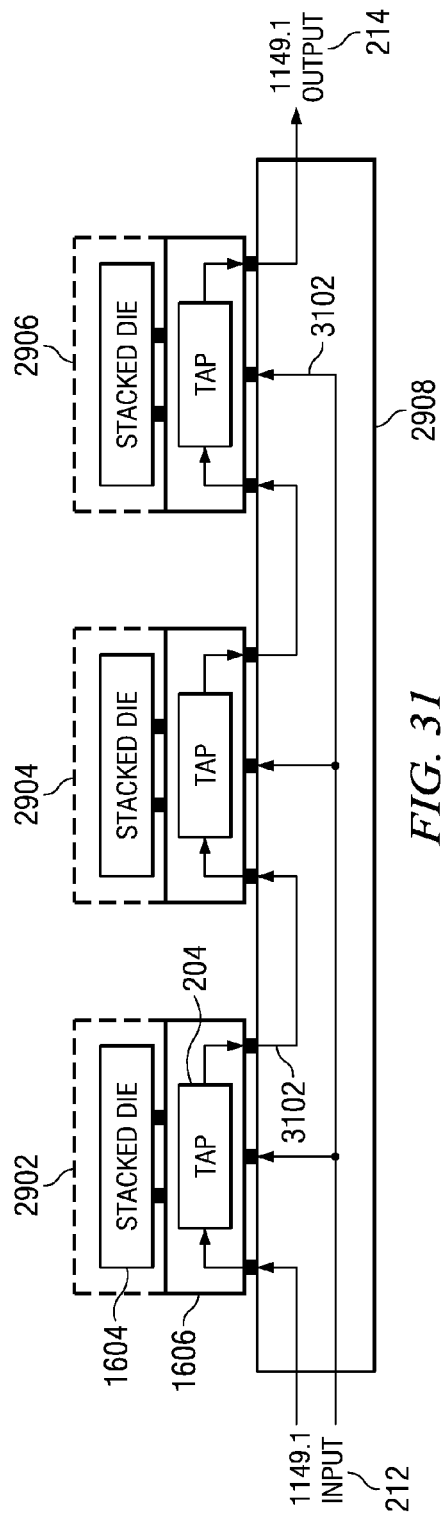

FIG. 31 illustrates the interposer TAPs 204 of devices 2902-2906 connected to a serial bussing path 3102 that connects the interposer TAPs to externally accessible 1149.1 TDI, TCK and TMS input signals 212 and the 1149.1 TDO output signal 214. When an 1149.1 controller is connected to the external 1149.1 input and output signals, the interposer TAPs can be serially accessed to perform test or other operations. One of the most important test operations the interposer TAPs perform is the verification that the FIN 106 and FOUT 108 of the each device 2902-2906 are properly connected together via the substrate bussing path 3002. Since the FIN and FOUT interconnects between the stacked die 1604 and interposer 1606 of each device 2902-2906 were tested after they were assembled to form the device, they do not need to be retested when the devices are mounted on the substrate. Only the FIN and FOUT interconnects between interposer and substrate need to be tested. This test operation is performed by loading Extest instructions into each interposer's TAP instruction register then operating the boundary register of each interposer TAP to test that the FIN and FOUT signals of the devices are properly connected together via the substrate.

Figure 15:
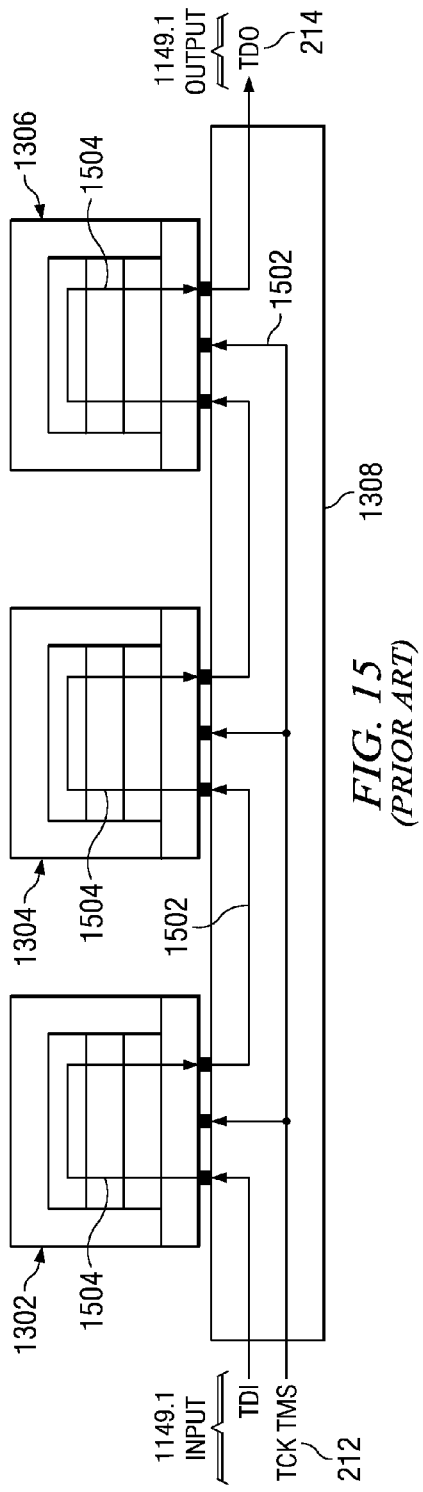

As can be seen in FIG. 31, the FIN 106 and FOUT 108 interconnect test between each device 2902-2906 is advantageously achieved using only the interposer TAP boundary register 206 of each device. Thus the FIN and FOUT interconnect test problems mentioned in regard to FIGS. 11 and 15 (i.e. the multiple TMS signal problem of FIG. 11 and multiple TAPs in series problem of FIG. 15) are eliminated by use of the 1149.1 interposer 1606 of present disclosure. Further, the use of the analog boundary scan cells of the disclosure in the interposer's boundary register to provide interconnect testing of analog FIN and FOUT signals adds a further improvement over the FIGS. 11 and 15 interconnect test approach, since the conventional 1149.1 boundary registers of FIGS. 11 and 15 only use digital boundary scan cells to perform interconnect testing of digital FIN and FOUT signals.

While the interposer boundary register 206 has been described up to this point comprising boundary scan cells as described in FIGS. 18-22, the interposer boundary register may include other types of boundary scan cells as well.

Figure 33:
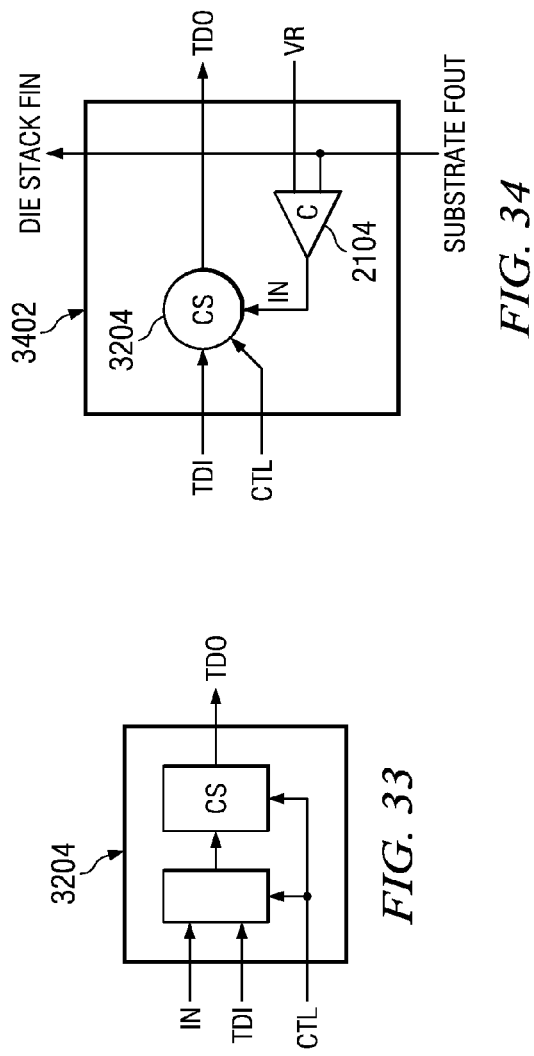
FIG. 33 illustrates detail of the scan cell of FIG. 32.
Figure 32:
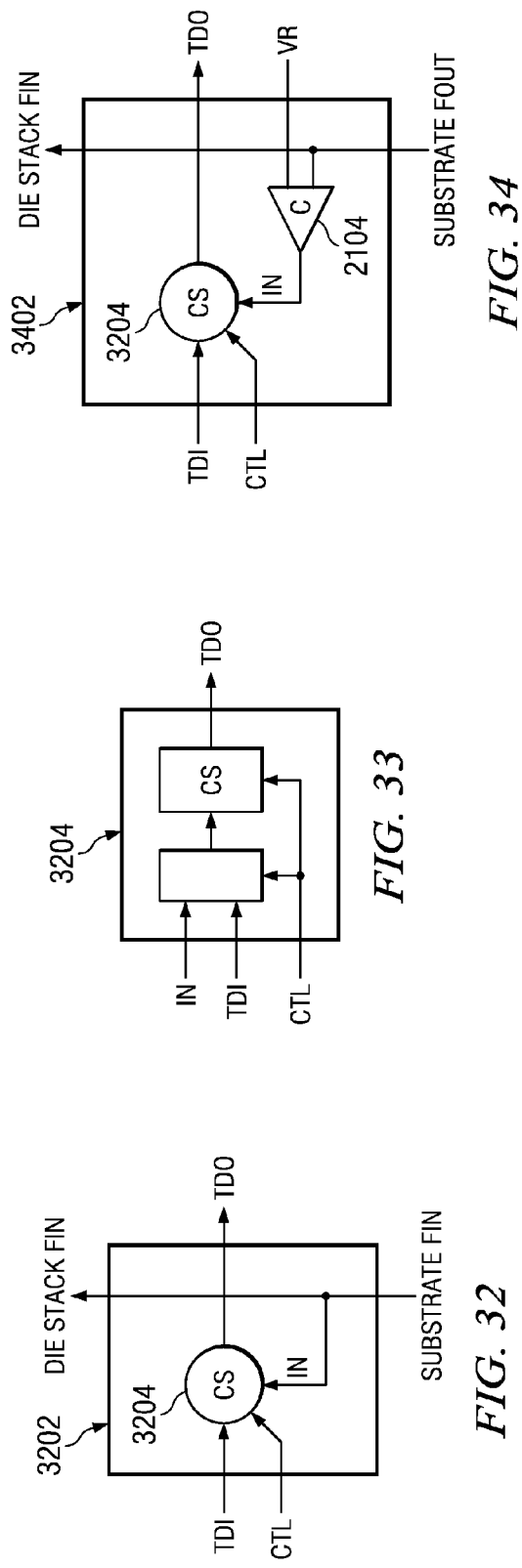
FIG. 32 illustrates an observe only digital boundary scan cell that can be used in the interposer according to the disclosure.

FIG. 32 illustrates a conventional observe only type digital input boundary scan cell 3202 that could be used in the interposer boundary register. This type of boundary scan cell would be used on high performance digital signals that cannot tolerate the multiplexer 1804 and buffer 1808 delay of the digital input boundary scan cell of FIG. 18. As seen, the digital input signal from the substrate passes directly through the interposer's signal path connection to be input to the die stack. The digital input boundary scan cell includes a capture and shift (CS) scan cell 3204 as depicted in FIG. 33. When either the Extest or Sample instruction is loaded into the TAP's instruction register, the CS scan cell can capture data from the digital signal path connection and shift it out on TDO.

Figure 34:
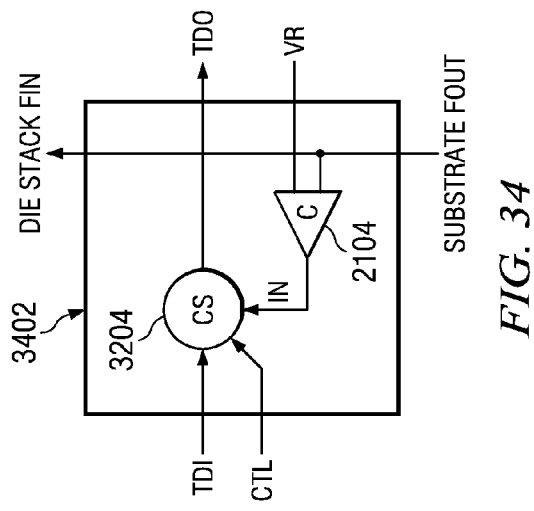
FIG. 34 illustrates an observe only analog boundary scan cell that can be used in the interposer according to the disclosure.

FIG. 34 illustrates an observe only analog input boundary scan cell 3402 that could be used in the interposer boundary register. This type of boundary scan cell would be used on high performance analog signals that cannot tolerate the switch 2108 and amplifier 2110 delay of the analog input boundary scan of FIG. 21. As seen, the analog input signal from the substrate passes directly through the interposer's signal path connection to be input to the die stack. The analog boundary scan cell includes a capture and shift (CS) scan cell 3204 and a digitizing comparator 2104 as described in FIG. 21. When either the Extest or Sample instruction is loaded into the TAP's instruction register, the CS scan cell can capture digitized data from the analog signal path connection and shift it out on TDO.

Figure 35:
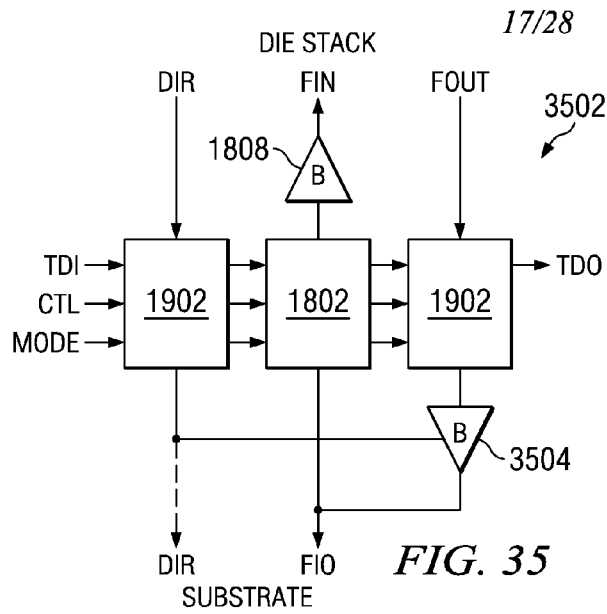
FIG. 35 illustrates a bidirectional digital boundary scan cell that can be used in the interposer according to the disclosure.

FIG. 35 illustrates a bidirectional digital boundary scan cell 3502 that could be used in the interposer boundary register. This type of boundary scan cell would be used on functional digital inputs and outputs of the die stack that are converted to a digital functional input and output (FIO) signal on the substrate. As seen, a direction (DIR) control signal from the die stack is coupled to the control input of a tristate buffer 3504 and optionally to the substrate via a digital output boundary scan cell 1902, a digital FOUT signal from the die stack is coupled to a digital FIO signal of the substrate via a digital output boundary scan cell 1902 and buffer 3504, and the digital FIO signal from the substrate is coupled to a digital FIN signal to the die stack via a digital input boundary scan cell 1802 and buffer 1808.

During functional output mode, the DIR signal from the die stack can enable buffer 3504 to output the digital FOUT signal from the die stack to the digital FIO signal of the substrate.

During functional input mode, the DIR signal from the die stack can disable buffer 3504 to allow the digital FIO signal from the substrate to drive the digital FIN signal to the die stack.

When a Sample instruction is loaded into the interposer's TAP instruction register, the output boundary scan cell 1902 on the DIR signal path can be operated to observe the DIR signal output of the die stack, the input boundary scan cell 1802 on the FIN signal path can be operated to observe the FIO signal of the substrate and the output boundary scan cell 1902 on the FOUT signal path can be operated to observe the FOUT signal from the die stack.

When an Extest instruction is loaded into the interposer's TAP instruction register, the output boundary scan cell 1902 on the DIR signal path can be operated to observe the DIR signal output of the die stack and control the control input of buffer 3504 and optionally the DIR output to the substrate, the input boundary scan cell 1802 on the FIN signal path can be operated to observe the FIO signal of the substrate and control the FIN signal to the die stack and the output boundary scan cell 1902 on the FOUT signal path can be operated to observe the FOUT signal from the die stack and control the data output to the substrate via buffer 3504.

Figure 36:
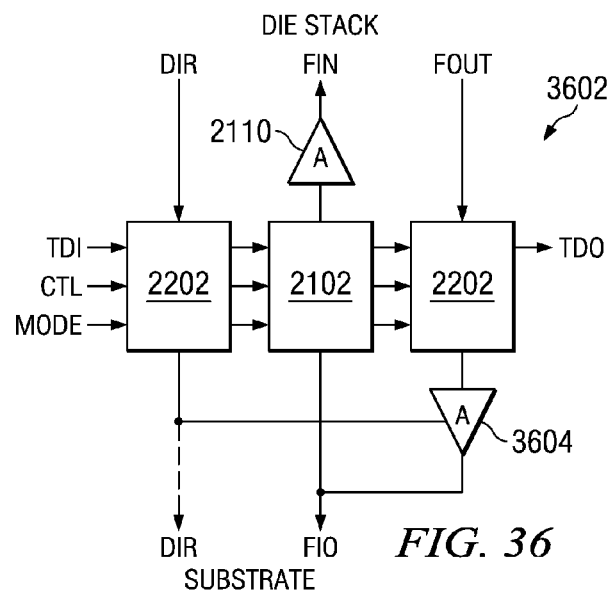
FIG. 36 illustrates a bidirectional analog boundary scan cell that can be used in the interposer according to the disclosure.

FIG. 36 illustrates a bidirectional analog boundary scan cell 3602 that could be used in the interposer boundary register. This type of boundary scan cell would be used on functional analog inputs and outputs of the die stack that are converted to an analog functional input and output (FIO) signal on the substrate. As seen, a direction (DIR) control signal from the die stack is coupled to the control input of a tristate amplifier 3604 and optionally to the substrate via an analog output boundary scan cell 2202, an analog FOUT signal from the die stack is coupled to an analog FIO signal of the substrate via an analog output boundary scan cell 2202 and amplifier 3604, and the analog FIO signal from the substrate is coupled to an analog FIN signal to the die stack via an analog input boundary scan cell 2102 and amplifier 2110.

During functional output mode, the DIR signal from the die stack can enable amplifier 3604 to output the analog FOUT signal from the die stack to the analog FIO signal of the substrate.

During functional input mode, the DIR signal from the die stack can disable amplifier 3604 to allow the analog FIO signal from the substrate to drive the analog FIN signal to the die stack.

When a Sample instruction is loaded into the interposer's TAP instruction register, the output boundary scan cell 2202 on the DIR signal path can be operated to observe the DIR signal output of the die stack, the input boundary scan cell 2102 on the FIN signal path can be operated to observe the FIO signal of the substrate and the output boundary scan cell 2202 on the FOUT signal path can be operated to observe the FOUT signal from the die stack.

When an Extest instruction is loaded into the interposer's TAP instruction register, the output boundary scan cell 2202 on the DIR signal path can be operated to observe the DIR signal output of the die stack and control the control input of amplifier 3604 and optionally the DIR output to the substrate, the input boundary scan cell 2102 on the FIN signal path can be operated to observe the FIO signal of the substrate and control the FIN signal to the die stack and the output boundary scan cell 2202 on the FOUT signal path can be operated to observe the FOUT signal from the die stack and control the data output to the substrate via amplifier 3604.

Figure 37:
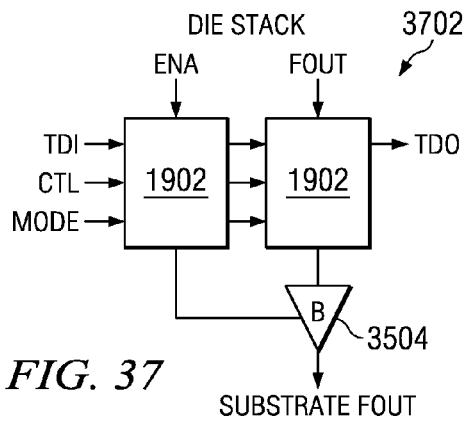
FIG. 37 illustrates a tristate digital boundary scan cell that can be used in the interposer according to the disclosure.

FIG. 37 illustrates a digital boundary scan cell 3702 that could be used in the interposer boundary register. This type of boundary scan cell would be used on functional digital outputs of the die stack that needed to be tristate-able on the substrate. As seen, an enable (ENA) control signal from the die stack is coupled to the control input of a tristate buffer 3504 via a digital output boundary scan cell 1902 and a digital FOUT signal from the die stack is coupled to a digital FIO signal of the substrate via a digital output boundary scan cell 1902 and buffer 3504.

During functional mode, the ENA signal from the die stack can enable buffer 3504 to output the digital FOUT signal from the die stack to the digital FIO signal of the substrate, or disable buffer 3504 from outputting the digital FOUT signal to the digital FIO signal of the substrate.

When a Sample instruction is loaded into the interposer's TAP instruction register, the output boundary scan cell 1902 on the ENA signal path can be operated to observe the ENA signal output of the die stack and the output boundary scan cell 1902 on the FOUT signal path can be operated to observe the FOUT signal from the die stack.

When an Extest instruction is loaded into the interposer's TAP instruction register, the output boundary scan cell 1902 on the ENA signal path can be operated to observe the ENA signal output of the die stack and control the control input of buffer 3504 and the output boundary scan cell 1902 on the FOUT signal path can be operated to observe the FOUT signal from the die stack and control the data output to the substrate via buffer 3504.

Figure 38:
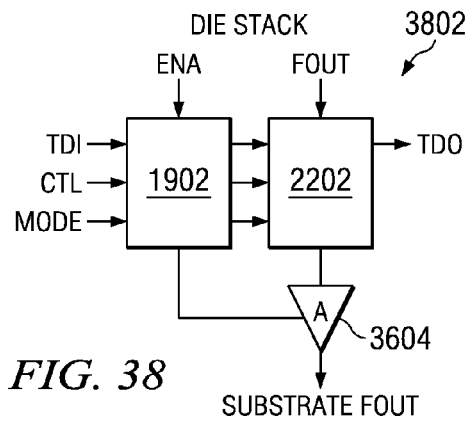
FIG. 38 illustrates a tristate analog boundary scan cell that can be used in the interposer according to the disclosure.

FIG. 38 illustrates an analog boundary scan cell 3802 that could be used in the interposer boundary register. This type of boundary scan cell would be used on functional analog outputs of the die stack that needed to be tristate-able on the substrate. As seen, an ENA control signal from the die stack is coupled to the control input of a tristate amplifier 3604 via a digital output boundary scan cell 1902 and an analog FOUT signal from the die stack is coupled to an analog FIO signal of the substrate via an analog output boundary scan cell 2202 and amplifier 3604.

During functional mode, the ENA signal from the die stack can enable amplifier 3604 to output the analog FOUT signal from the die stack to the analog FIO signal of the substrate, or disable amplifier 3604 from outputting the analog FOUT signal to the analog FIO signal of the substrate.

When a Sample instruction is loaded into the interposer's TAP instruction register, the output boundary scan cell 1902 on the ENA signal path can be operated to observe the ENA signal output of the die stack and the output boundary scan cell 2202 on the FOUT signal path can be operated to observe the FOUT signal from the die stack.

When an Extest instruction is loaded into the interposer's TAP instruction register, the output boundary scan cell 1902 on the ENA signal path can be operated to observe the ENA signal output of the die stack and control the control input of amplifier 3604 and the output boundary scan cell 2202 on the FOUT signal path can be operated to observe the FOUT signal from the die stack and control the data output to the substrate via amplifier 3604.

Use of 1149.1 Clamp Instruction

While the disclosure has mentioned use of the 1149.1 Extest and Sample instruction, the 1149.1 Clamp instruction can also be used to control an interposer's boundary register that is composed of the boundary scan cells described in regard to FIGS. 18, 19, 21, 22, 35, 36, 37 and 38. The Clamp instruction allows data that has been preloaded (using the 1149.1 Preload instruction) into the boundary scan cells to be statically output from the boundary scan cells while the TAP's single bit Bypass register is selected for access between the TAP's TDI and TDO signals. During the Clamp instruction, interposer input boundary scan cells of FIGS. 18 and 21 can maintain static inputs to the die stack and output boundary scan cells of FIGS. 19 and 22 can maintain static outputs to the substrate. The static conditions may include a digital or analog high level state, a digital or analog low level state or a disabled (tristate) state.

Once a TAP has been included into an interposer for the purpose of providing the above described boundary scan test operations, it can be used for other operations as described in FIGS. 39-55 below.

Figure 39:
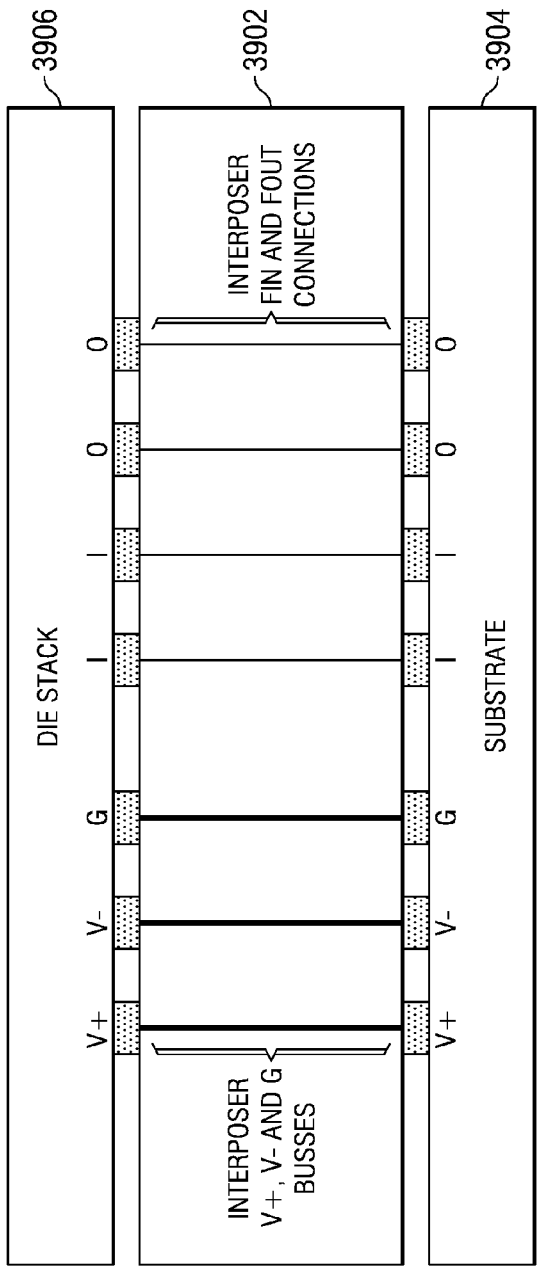
FIG. 39 illustrates voltage, ground and signal connections in an interposer.

FIG. 39 illustrates a conventional interposer 3902 providing example V+, V− and G busses and FIN and FOUT signal connections between a system substrate 3904 and a die stack 3906. Since the die stack can consume a large amount of power during functional operation, the V+, V− and G busses paths must provide low impedance paths between the system substrate and die stack to reduce the voltage drop across the V+, V− and G bussing paths, which could effect the functional operation of the die stack and the system it operates in. It would be advantageous to be able to monitor in real time the voltage drop across the V+, V− and G bussing paths during functional operation of the die stack in the system. Further, it would be advantageous to monitor in real time the functional activity of the FIN and FOUT signals in the system.

Figure 40:
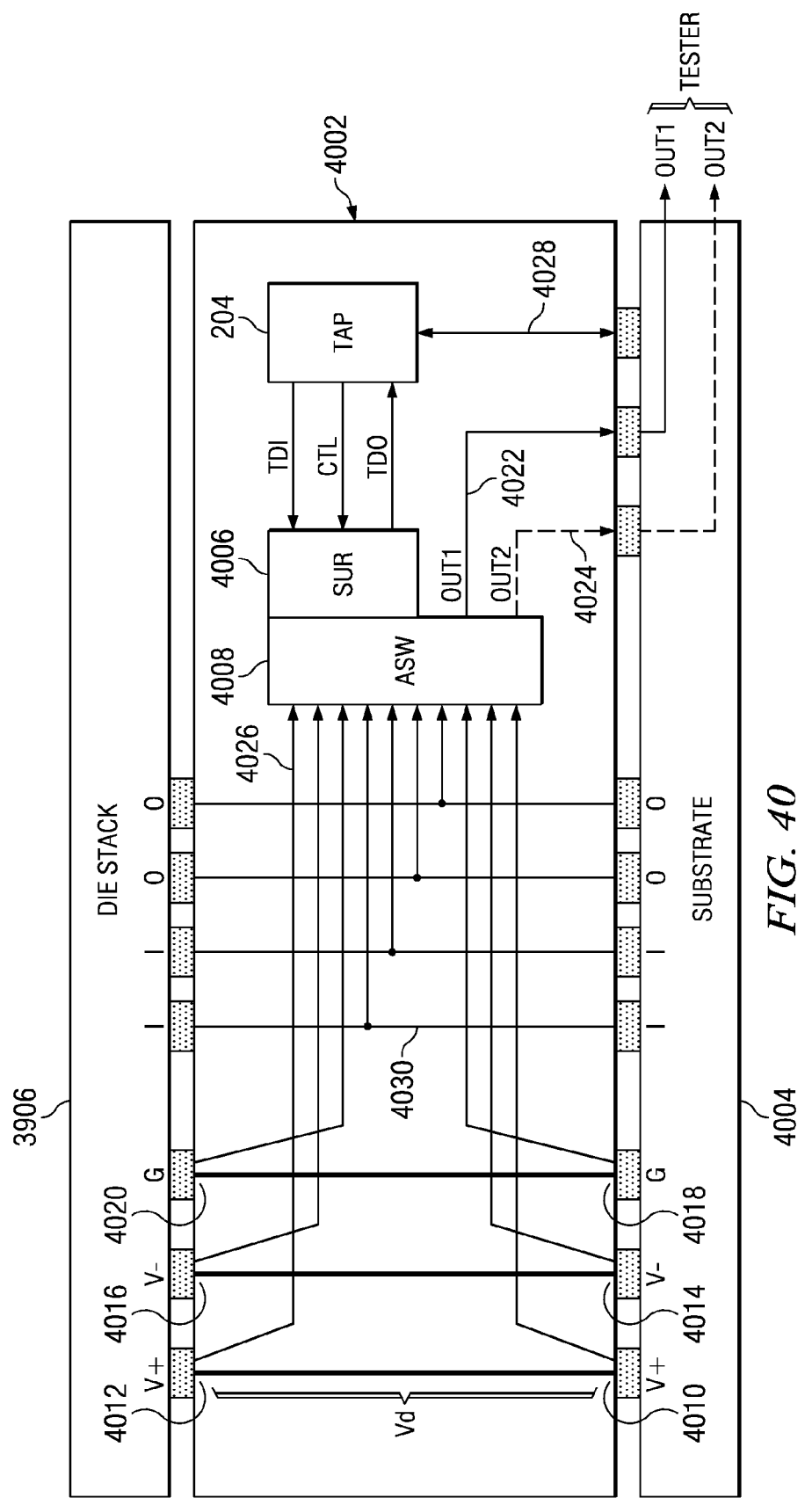
FIG. 40 illustrates an interposer augmented with a TAP controlled switch to monitor/measure the signal connections of FIG. 39 according to the disclosure.

FIG. 40 illustrates an interposer 4002 of the present disclosure coupling die stack 3906 to a substrate 4004. As seen, interposer 4002 provides the V+, V−, G, FIN and FOUT connection paths of interposer 3902 of FIG. 39. Further, and according the disclosure, interposer 4002 provides a TAP 204, a shift update register (SUR) 4006 (as described in regard to FIGS. 24 and 25) and an analog switch (ASW) 4008. The SUR 4006 is coupled to the TAP 204 as a selectable data register that can be accessed from TDI to TDO by a TAP instruction to control ASW 4008. For simplification the TAPs 1149.1 interface to the substrate is indicated by line 4028. ASW 4008 receives input from SUR 4006 to select from a plurality of inputs 4026 that can be coupled to at least one (OUT1) 4022 or more (OUT2) 4024 outputs. During operation, the ASW can be controlled by the SUR to select a different one or more inputs 4026 and output the one or more inputs to the substrate, via OUT1 or OUT1 and OUT2. The OUT1 and OUT2 signals of the substrate can be output to a tester or other instrument to examine the signals. The present disclosure provides support for two types to signal examination, differential signal examination and single ended signal examination.

During the differential signal examination method, a first signal is output on OUT1 and a second signal is output on OUT2. A tester or other instrument measures and analyzes the OUT1 and OUT2 signals to determine if they are operating at expected voltage levels. The differential method can be used to monitor the difference in voltage levels between any two signals, including the voltage drop (Vd) between the substrate contact points 4010, 4014 and 4018 and the die stack contact points 4012, 4016 and 4020 of the interposer, respectively. For example, to measure the voltage drop across the V+ bus from contact point 4012 to contact point 4010, the SUR 4006 can be set to cause the ASW 4008 to output the voltage at the die stack V+ contact point 4012 on OUT1 and the voltage of the substrate V+ contact point 4010 on OUT2. A tester or other instrument connected to the OUT1 and OUT2 signals of the substrate 4004 can measure each voltage and determine the voltage drop across the V+ bussing path between the contact points. By knowing the impedance of the of the V+ bussing path, which can be measured when the interposer is tested prior to assembly, the current flowing to the die stack via the V+ bussing path can also be determined. Continuous real time measurements of the voltage drop across the V+ bussing path can be used to characterize/trace the V+ power consumption of the die stack during its functional operation. It can also be used to detect low V+ supply voltage levels at the die stack which may cause improper operation of the die stack. The voltage drop across the V− bussing path from contact points 4016 and 4014 and the voltage drop across the G bussing path from contact points 4020 and 4018 can be similarly accessed for continuous real time measurement of the voltage drops across each path for the above mentioned reasons.

During the single end signal examination method, a signal is output on OUT1. The OUT2 signal is not required (as indicated by dotted line) if only single ended examination method is used. A tester or other instrument measures and analyzes the OUT1 signal to determine if it is operating at expected voltage levels. The single ended examination method can be used to monitor the difference in voltage levels between any two signals, including the voltage drop (Vd)

between the substrate contact points 4010, 4014 and 4018 and the die stack contact points 4012, 4016 and 4020 of the interposer, respectively. For example, to measure the voltage drop across the V+ bus from contact point 4012 to contact point 4010, the SUR 4006 can set the ASW 4008 to output the voltage at the die stack V+ contact point 4012 on OUT1 for measurement by a tester or other instrument, then the SUR is set to cause the ASW to output the voltage at the substrate V+ contact point 4010 on OUT1 for measurement by the tester or other instrument. The tester or other instrument analyzes the voltages at the two contact points and to determine the voltage drop across the V+ bussing path. Since the single ended voltage drop examination method requires two steps separated in time, it cannot perform the continuous real time voltage drop measurement provided by the differential examination method described above. The voltage drop across the V− bussing path from contact points 4016 and 4014 and the voltage drop across the G bussing path from contact points 4020 and 4018 can be similarly accessed using the single ended examination method described above.

In addition to using the SUR and ASW to measure voltages as described above, the SUR and ASW can be used to monitor, in real time, the functional activity of signals on the interposer's FIN and FOUT connections 4030. Real time single ended monitoring allows one FIN or FOUT signal to be selected and output on the OUT1 signal. Real time differential monitoring allows two FIN or FOUT signals to be selected and output on the OUT1 and OUT2 signals. A tester or other instrument connected to the OUT1 or OUT1 and OUT2 signals can monitor or trace the functional operation of the selected signal(s).

Figure 41:
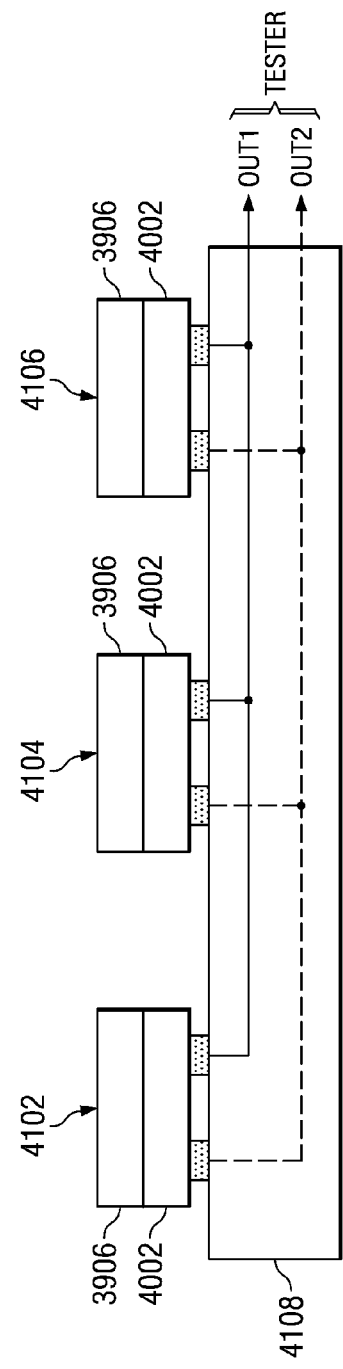
FIG. 41 illustrates an arrangement of the interposers of FIG. 40 on a system substrate according to the disclosure.

FIG. 41 illustrates three devices each including the stacked die 3906 and interpose 4002 of FIG. 40 mounted on a substrate 4108. The substrate provides OUT1 and OUT2 signal paths that are connected to the OUT1 and OUT2 signals of each devices interposer 4002. The substrate provides external access of the OUT1 and OUT2 bussing paths to a tester or other instrument. The purpose of this illustration is to simply show that since the OUT1 and OUT2 signals of the interposers are commonly connected on the OUT1 and OUT2 signal paths, only one interposer can be enabled at a time to output its OUT1 and OUT2 signals to the tester or other instrument. When one interposer is selected for outputting its OUT1 and OUT2 signals, the other interposers are disabled from outputting their OUT1 and OUT2 signals.

Figure 42:
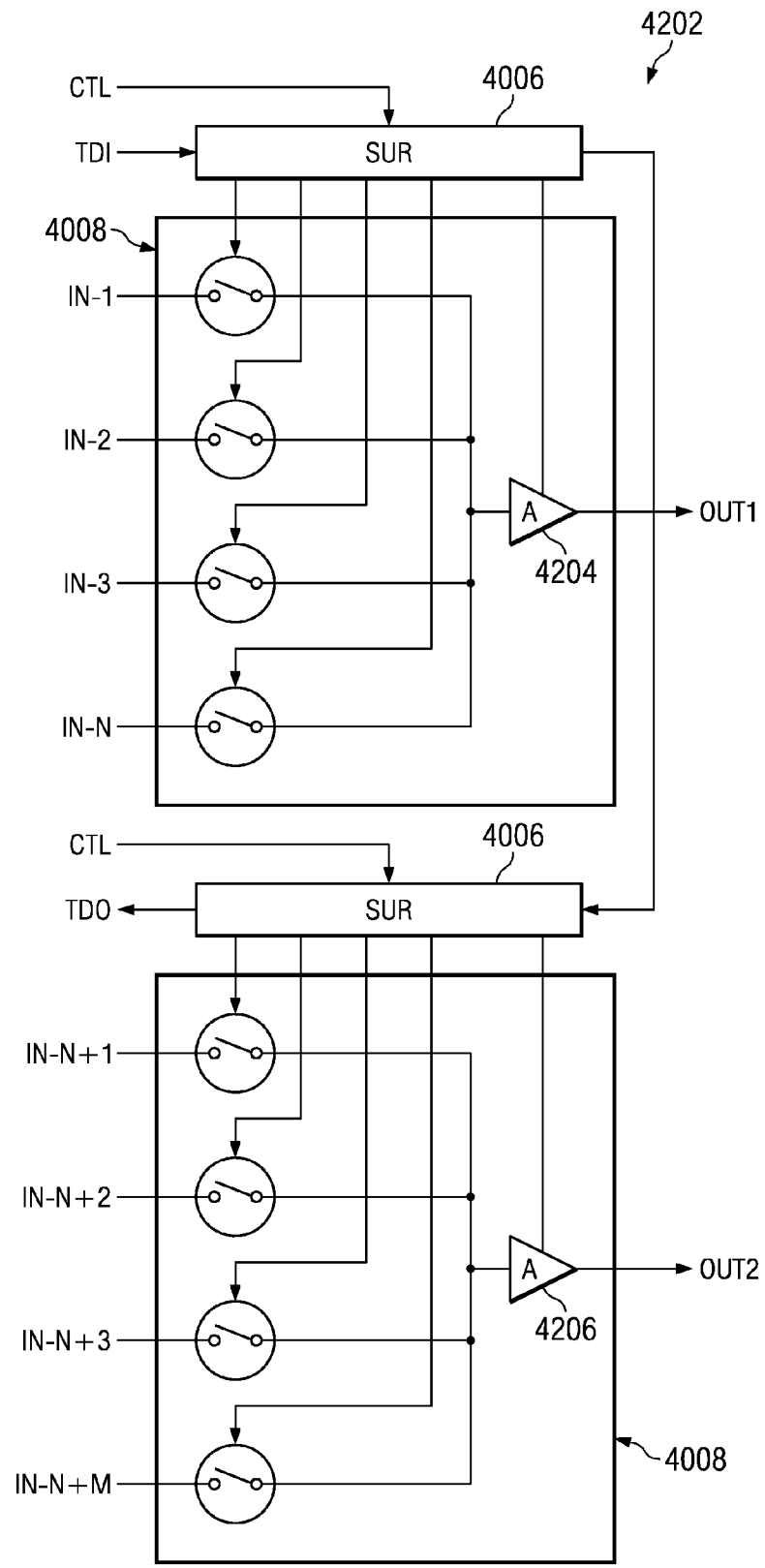
FIG. 42 illustrates a switch of FIG. 40 capable of differential signal monitoring/measurement according to the disclosure.

FIG. 42 illustrates an example differential SUR and ASW circuit 4202. The circuit 4202 includes first and second SUR 4006 sections and first and second ASW sections 4008. The first SUR section controls the opening and closing of discrete switches in the first ASW section and the second SUR section controls the opening and closing of discrete switches in the second ASW section. The discrete switches have unique inputs (IN−1 through IN−N+M) that can be connected to a bus or signal path in the interposer, commonly connected outputs and a control input from the SUR. The commonly connected outputs are input to a tristate unity gain voltage follower amplifier (A) 4204 or 4206. Amplifier 4204 of the first ASW section receives control input from the first SUR to enable or disable the amplifier's output. Amplifier 4206 of the second ASW section receives control input from the second SUR to enable of disable the amplifier's output. When amplifier 4204 is enabled it outputs the selected input (IN−1 through IN−N) on the OUT1 output of the interposer. When amplifier 4206 is enabled it outputs the selected input (IN−N+1 through IN−N+M) on the OUT2 output of the interposer. The use of tristate amplifiers 4204 and 4206 allows the OUT1 and OUT2 signals of interposers to be commonly connected to the substrate's OUT1 and OUT2 signal paths respectively, as described in FIG. 41.

Figure 43:
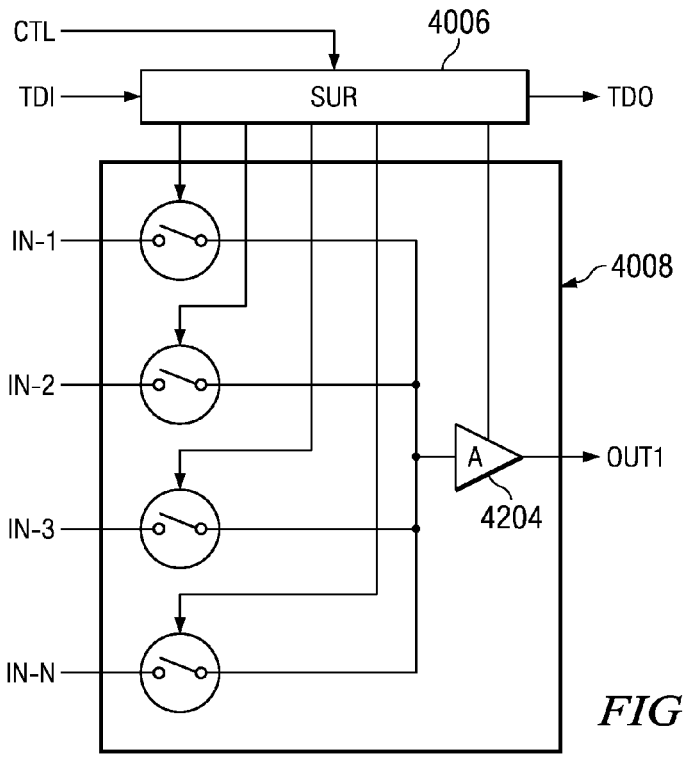
FIG. 43 illustrates a switch of FIG. 40 capable of single ended signal monitoring/measurement according to the disclosure.

FIG. 43 is provided to illustrate that a single ended SUR and ASW circuit 4202 only includes the first SUR section 4006 and first ASW section 4008 of the differential circuit 4202 of FIG. 41.

Figure 44:
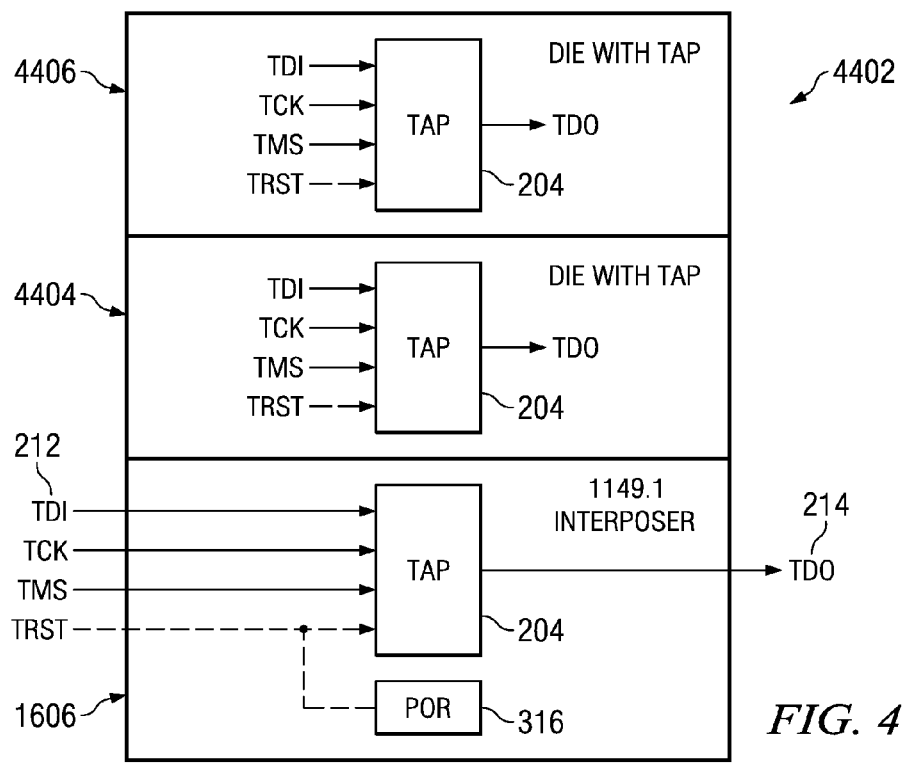
FIG. 44 illustrates an interposer and first and second die each including a TAP according to the disclosure.

FIG. 44 illustrates a device 4402 comprising the interposer 1606 of the present disclosure and two stacked die 4404 and 4406 that include a TAP 204. The TAP 204 of the interposer can be accessed via the 1149.1 inputs 212 and 1149.1 output 214 of the interposer as previously described. However the TAPs in die 4404 and 4406 cannot be accessed by the 1149.1 inputs 212 and 1149.1 output 214 of the interposer. Thus test, debug and other capabilities that may be provided in the TAPs of die 4404 and 4406 cannot be accessed using the interposer of the present disclosure as described up to this point.

Figure 45:
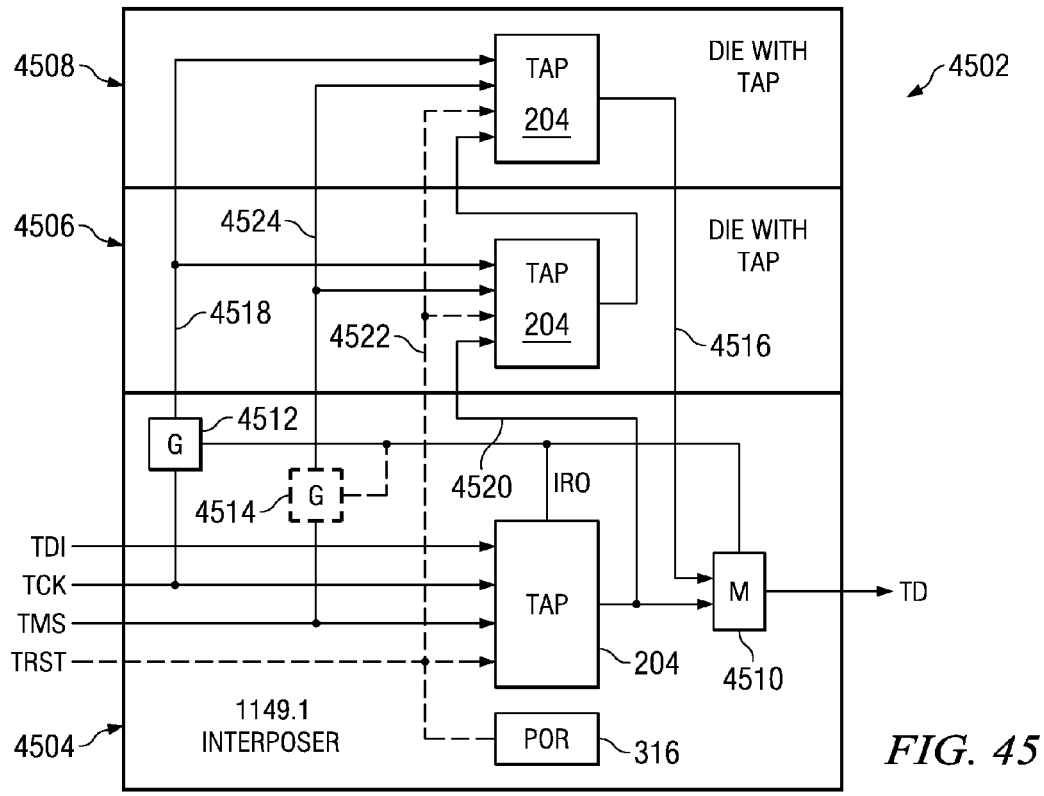
FIG. 45 illustrates a apparatus for selectively connecting or disconnecting the interposer to or from the die TAPs of FIG. 44 according to the disclosure.

FIG. 45 illustrates a device 4502 comprising an interposer 4504 of the present disclosure and two stacked die 4504 and 4506 that include a TAP 204. While two stacked die with TAPs are shown any number may be stacked. Also only a single die may exist on the interposer.

The interposer 4504 is the same as interposer 1606 of FIG. 44 with the following exceptions. (1) A multiplexer 4510 has been added to interposer 4504. The multiplexer has an input for receiving a first TDO signal from interposer TAP 204, an input for receiving a second TDO signal from the TAP 204 of die 4508 via a TSV path 4516 in die 4506, a control input from the IRO output of interposer TAP 204 and an output coupled to the TDO output of the interposer.

(2) A gating circuit 4512 has been added to interposer 4504. Gating circuit 4512 has an input for receiving the TCK input of the interposer, an input for receiving an enable signal from the IRO output of the interposer TAP 204 and an output coupled to the TCK input of the TAPs of die 4506 and 4508 via TSV path 4518 in die 4506. (3) The TDO of the interposer TAP is coupled to the TDI input of the TAP of die 4506 via a signal path 4520 between the interposer and die 4506. (4) The TRST input of the interposer, if implemented, or the output of the POR circuit 316 of the interposer 204 is coupled to the TRST inputs of the TAPs of die 4506 and 4508 via TSV path 4522. Note, if the die 4506 and 4508 have their own POR circuit, this TRST connection between the interposer and die TAPs may not be necessary. (5) Optionally, a gating circuit 4514, such as shown in FIG. 47, may be added to interposer 4504 in place of or in combination with gating circuit 4512. Gating circuit 4514, if added, has an input for receiving the TMS input of the interposer, an input for receiving an enable signal from the IRO output of the interposer TAP 204 and an output coupled to the TMS input of the TAPs of die 4506 and 4508 via TSV path 4524.

Figure 3A:
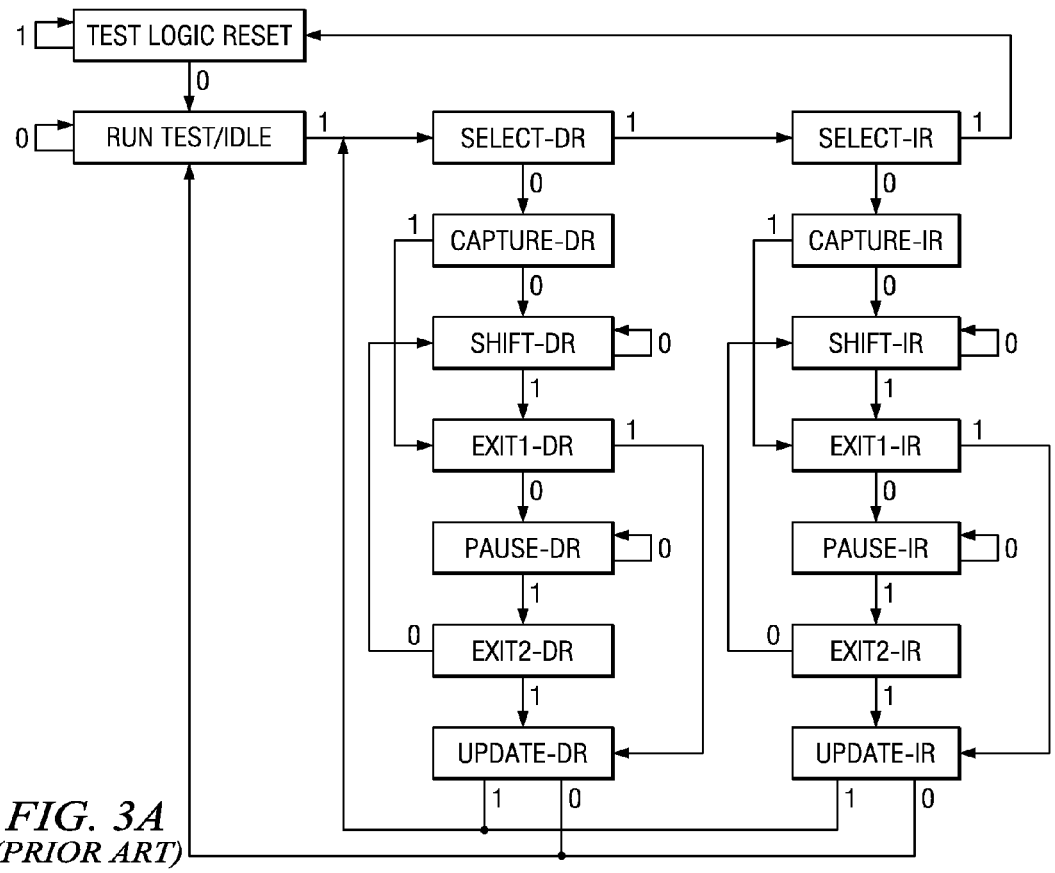
FIG. 3A illustrates the TAP state diagram.
Figure 3:
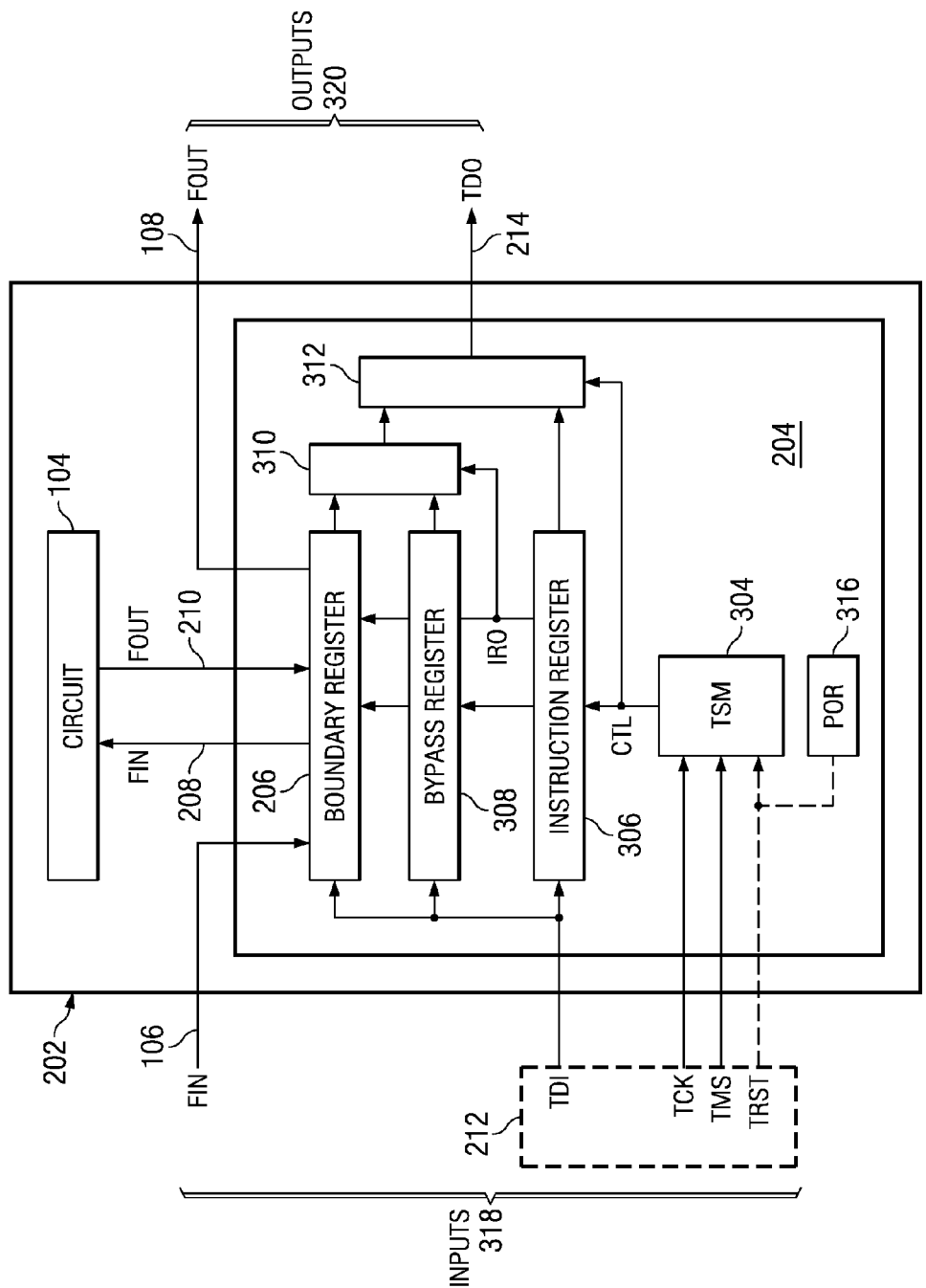
FIG. 3 illustrates a more detail view of the TAP circuitry of FIG. 2.
Figure 4:
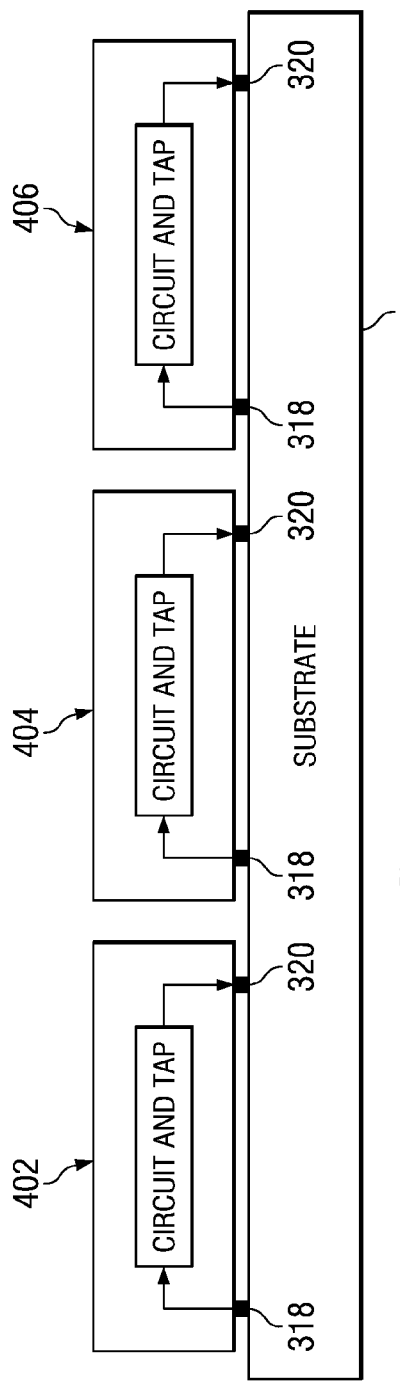
FIG. 4 illustrate devices on a substrate.
Figure 5:
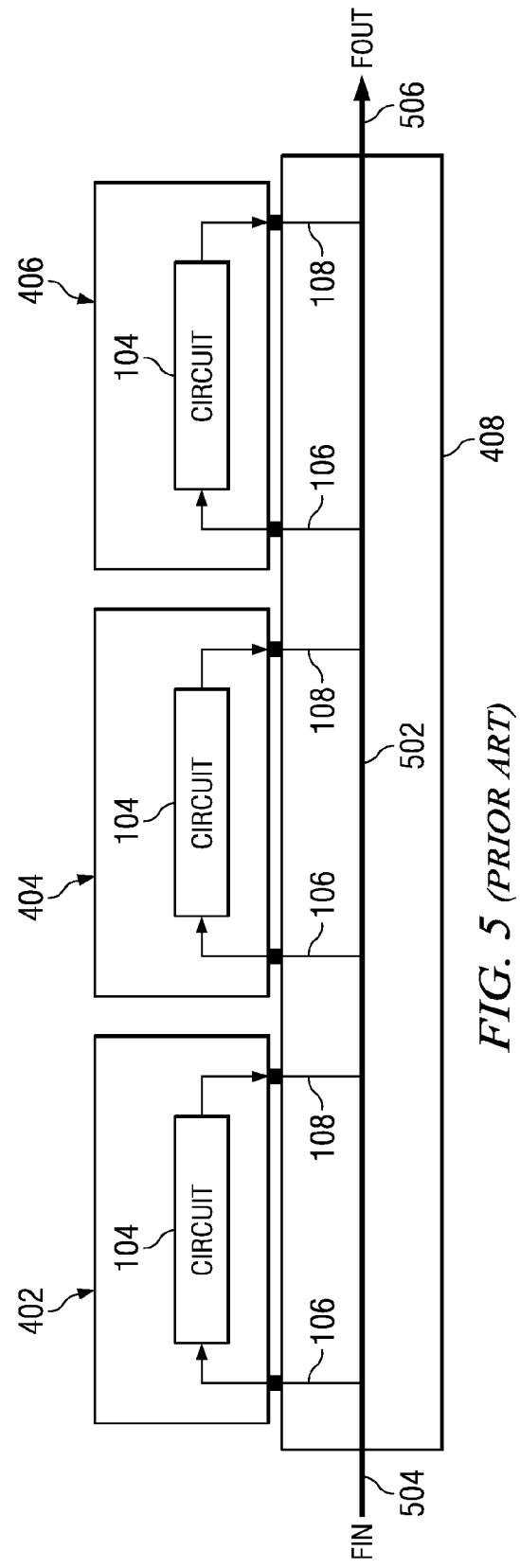
FIG. 5 illustrates the device functional I/O substrate connections.
Figure 6:
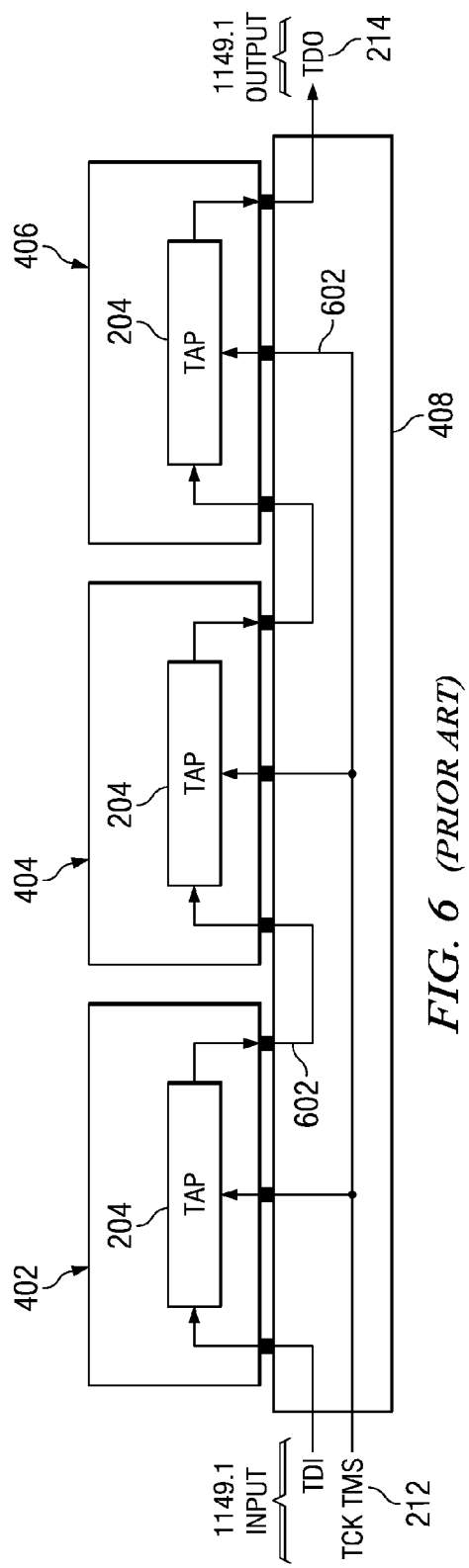
FIG. 6 illustrates the device test I/O substrate connections
Figure 9:
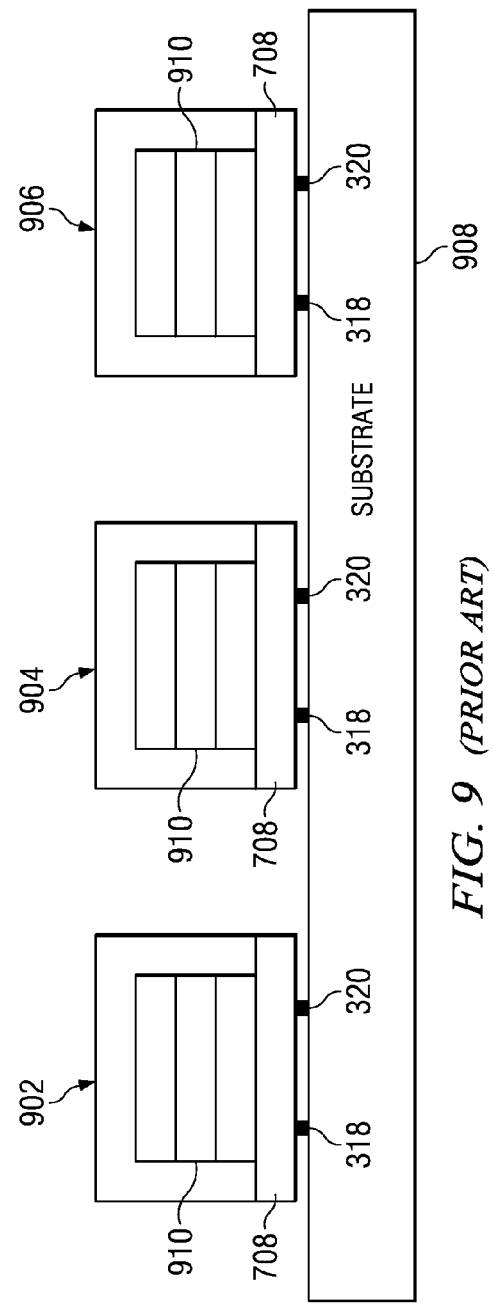
Figure 7:
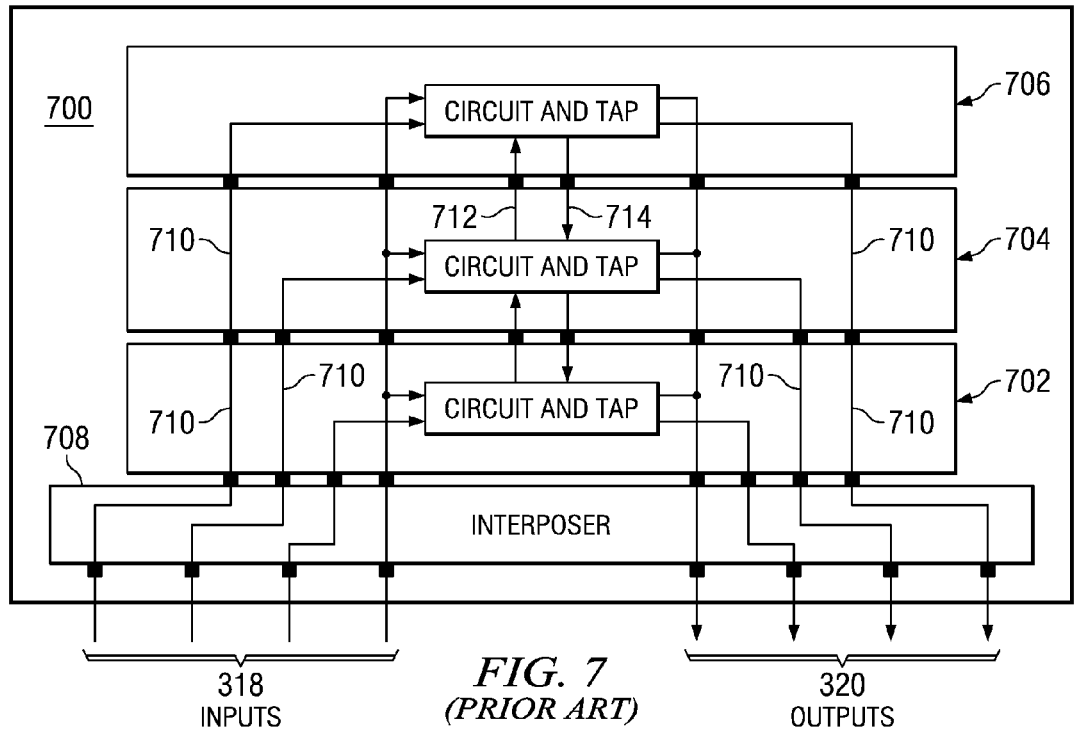
FIG. 7 illustrates an interposer and stacked die arrangement using TSVs.
Figure 8:
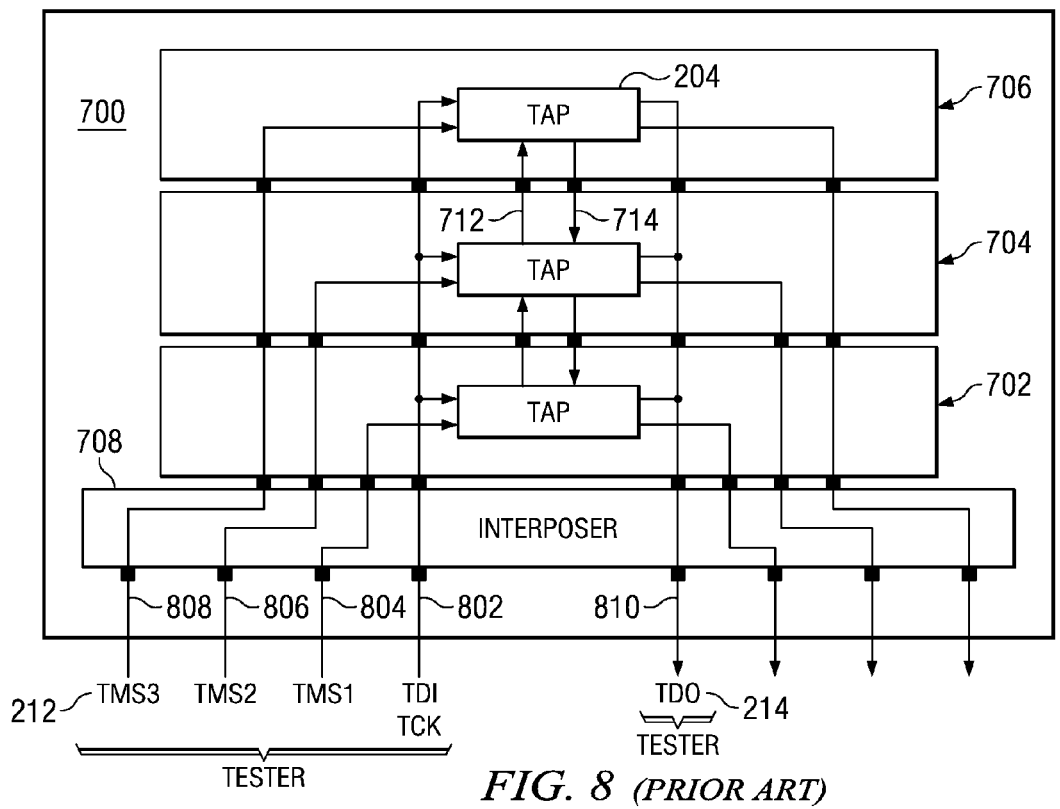
FIG. 8 illustrates TAP test input and output interposer connections using multiple TMS signals.
Figure 12:
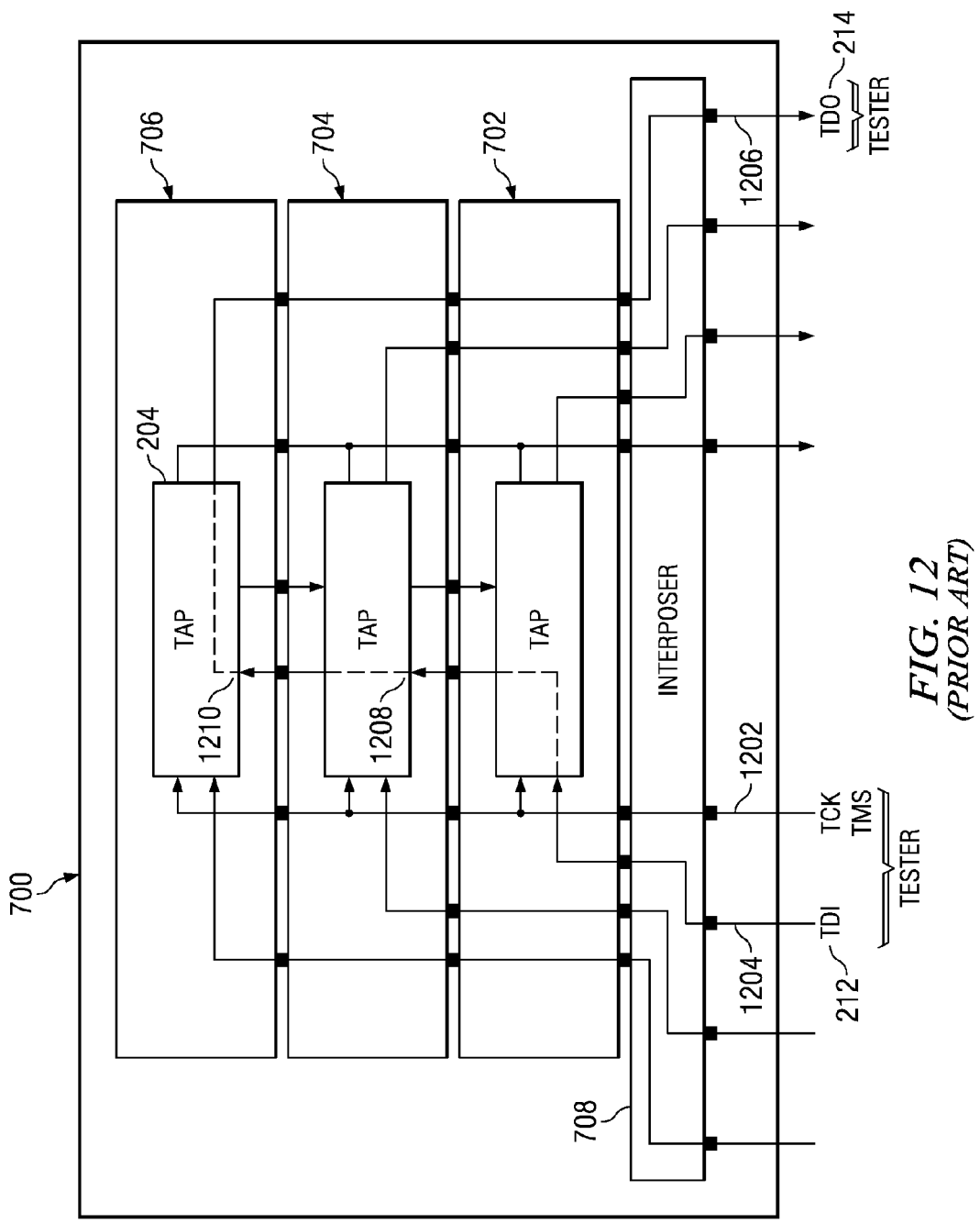
FIG. 12 illustrates TAP test input and output interposer connections using a single TMS signal.
Figure 13:
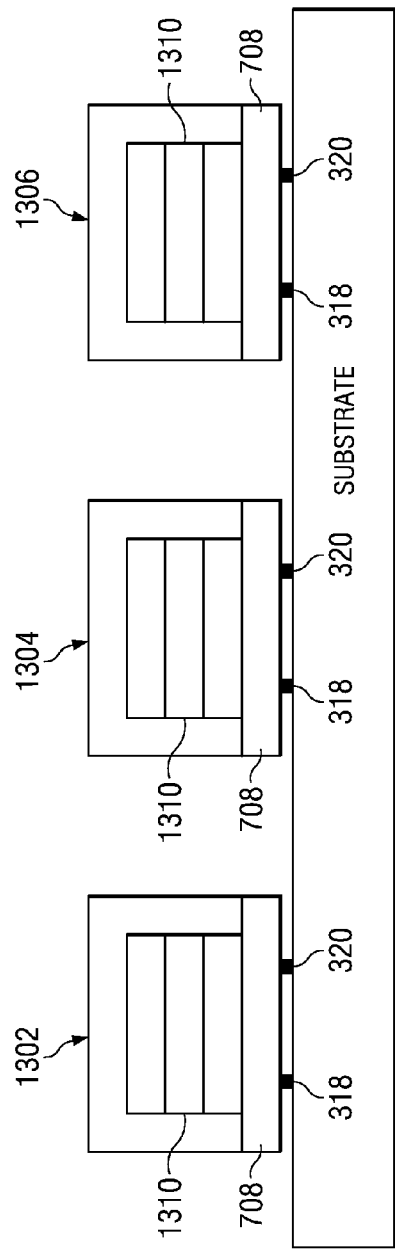
FIGS. 13-15 illustrate the functional and test substrate connections using single TMS signal.
Figure 14:
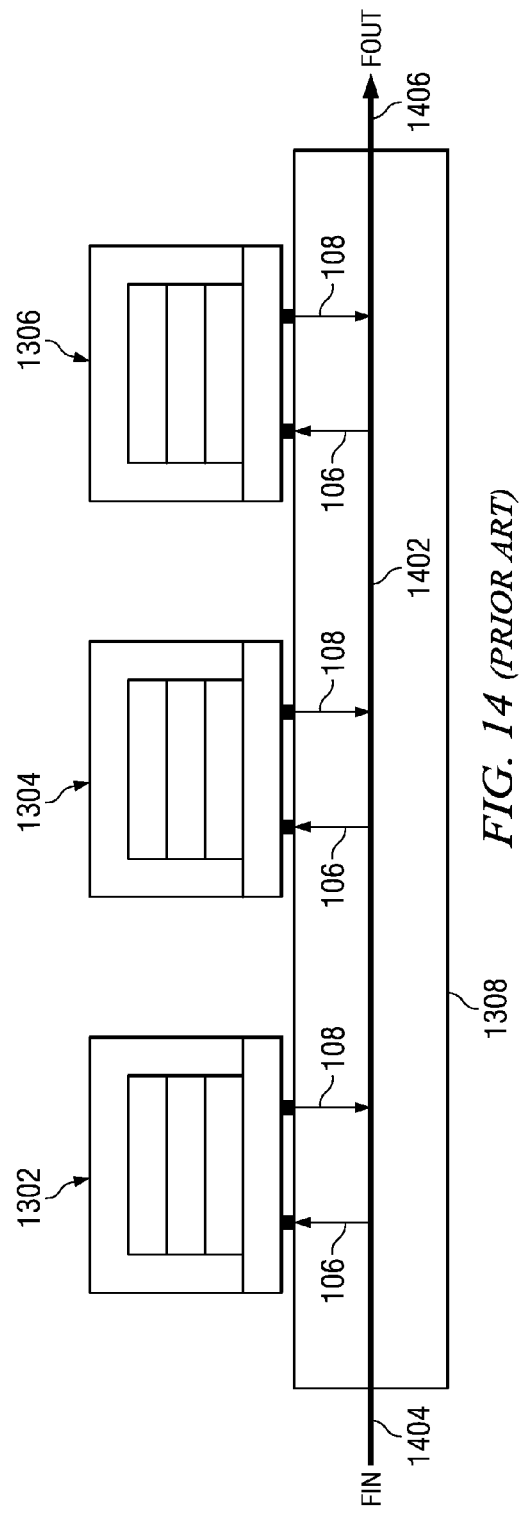

In response to a TRST input or a POR signal, the TAPs of the interposer, die 4506 and die 4508 will be reset to the Test Logic Reset state of FIG. 3A and the instruction register of the TAPs will be set to either the Bypass instruction or to the optional IDCode instruction if it is implemented. During either of these instructions, the IRO output of the interposer TAP will set the control input to multiplexer 4510 to select the interposer TAP's TDO to be coupled to the interposer's TDO output 214. Also the enable input to gating circuit 4512 will be set to gate off the TCK input of the TAPs of die 4506 and 4508. If implemented, the enable input to gating circuit 4514 will be set to gate off the TMS input of the TAPs of die 4506 and 4508.

Following reset, the die TAPs are disabled from access and the interposer TAP is enabled for access. The TAP of interposer 4504 can be accessed by the interposer's 1149.1 input and output signals exactly as the TAP of interposer 1606 has been described being accessed. Indeed, following reset, the operations of interposer 4504 and interposer 1606 are identical.

When it is desired to access the TAPs of die 4506 and 4508, a die stack access instruction is shifted into and updated from the TAP instruction register of interposer 4504. The die stack access instruction will set the enable signal on the TAP's IRO output to allow TCK to pass through gating circuit 4512 to the TCK input of the TAPs of die 4506 and 4508. If implemented the enable signal will allow TMS to pass through gating circuit 4514 to the TMS input of the TAPs of die 4506 and 4508. The die stack access instruction will also set the control signal to multiplexer 4510 to couple the TDO output of the TAP of die 4508 to the TDO output of interposer 4504. In response to the die stack access instruction, the interposer TAP, die 4506 TAP and die 4508 TAP are all serially connected between the interposer TDI and TDO signals and all respond to the TCK and TMS signals to perform data register scan and instruction register scan operations from TDI to TDO. To maintain the serial TAP access arrangement, any further die stack access instruction loaded into the instruction register of the interposer TAP must keep the enable and control signals from IRO outputs set such that the die TAPs receive TCK and TMS signals and the TDO of the TAP of die 4508 is coupled to the TDO output of the interposer.

When access to the die TAP has been completed, a non-die stack access instruction is scanned into the interposer TAP that sets the enable and control signals of the IRO output to states that disable the TCK and/or TMS signals to the die TAPs and cause the TDO output of the interposer TAP to be coupled to the TDO output of the interposer. In response to any further non-die stack access instruction loaded into the interposer TAP instruction register, data will pass only through the interposer TAP from TDI to TDO.

It is important to note that while the interposer 4504 is shown providing access to two stacked die with TAPs, it can similarly provide access to any number of stacked die with TAPs by serially connecting the TAPs of the stacked die in series the TAP of the interposer.

Figure 45A:
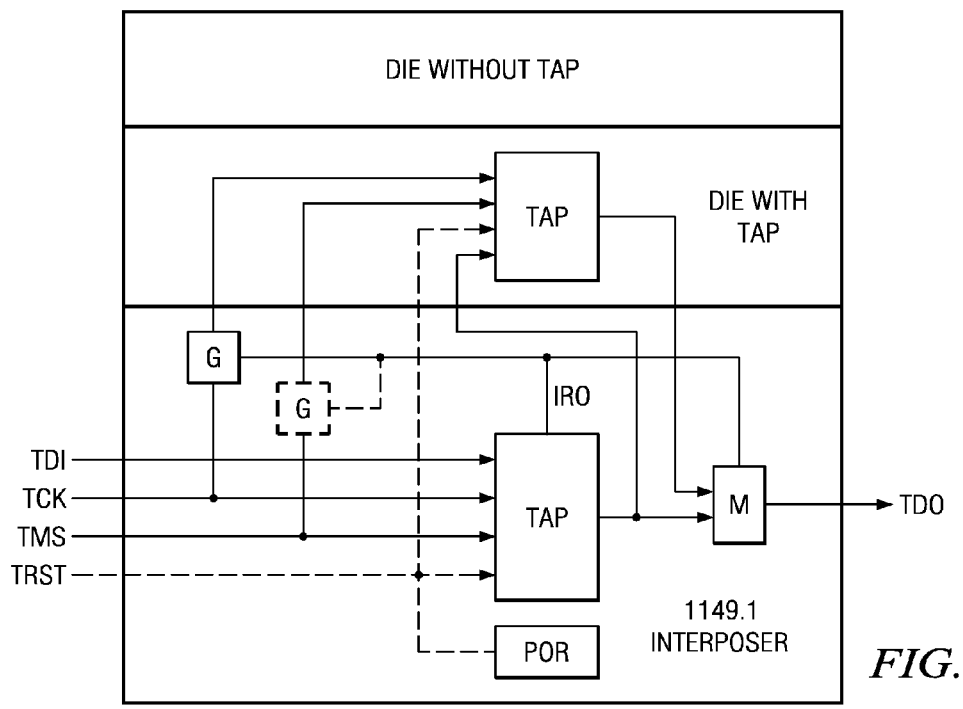
FIG. 45A illustrates two stacked die, one with a TAP and the other without a TAP, connected to an interposer according to the disclosure.

It is also important to note that a die stack may include a die with a TAP and a die without a TAP. In this case the die with the TAP may be serially connected to the interposer TAP as shown in FIG. 45A.

FIG. 46 illustrates an example implementation of gating circuit 4512 which comprises a And gate and a flip flop (FF). The TCK signal is input to an input of the And gate and to the inverted clock input of the FF. The enable (ENA) signal from the interposer TAP IRO output is input to the data input of the FF and the data output of the FF is input to the other input of the And gate. The output of the FF is the ON/OFF Gate signal enables the And gate to pass the TCK signal to its output or disables And gate from passing the TCK signal to its output. The output of the And gate is connected to the TCK inputs of the die TAPs. While not shown in FIG. 45, the FF receives a reset input from either the TRST signal, the POR circuit 316 or from a TAP reset output when the TAP is in the Test Logic Reset (TLR) state of FIG. 3A.

FIG. 47 illustrates the operation sequences of gating circuit 4512 that include a gate "ON" sequence 4702 that enables the TCK to the TAPs of the stacked die, an access sequence 4704 where the TAPs of the stacked die are access from the interposer's TDI and TDO and a gate "OFF" sequence 4706, that disables the TCK to the TAPs of the stacked die after access is complete.

In gate "ON" sequence 4702, a die stack access instruction is shifted into and updated from the instruction register of the interposer TAP. The update operation occurs after the falling TCK edge 4708 in the Update-IR (UIR) state 4716 of FIG. 3A. As seen the ENA signal of the updated IRO bus goes high shortly after falling TCK edge 4708. From the UIR state 4716, the interposer TAP transitions to the Run Test/Idle (RTI) state 4718 of FIG. 3A on rising TCK edge 4710. The ENA signal is clocked into the FF on the falling TCK edge 4712 of RTI state 4718, which changes the gate output of the FF from OFF to ON. The interposer TAP remains in the RTI state 4720 for at least one additional TCK period. The die TAPs start receiving TCKs 4714 during the one additional TCK in the second RTI state 4720. If the die TAPs were in RTI state prior to their TCK being enabled, they will remain in the RTI state during this one additional TCK period in RTI state 4720. If the die TAPs were in the Test Logic Reset (TLR) state of FIG. 3A, they will transition to the RTI state to synchronize themselves with the RTI state of the interposer TAP during this one additional TCK period in RTI state 4720. From RTI state 4720 the interposer TAP and die TAPs can transition together from the RTI states to other states of FIG. 3A to perform instruction and data scan access operations, as shown in access sequence 4704.

After access to the stacked die is complete, a non-die access instruction is shifted in the instruction register of the interpose TAP and updated on the falling edge 4722 the UIR state 4724, which sets the ENA signal of the IRO bus low. From the UIR state 4724 the interposer and die TAPs transition to the RTI state 4730. On the falling edge 4728 of RTI state 4730 the FF inputs the ENA signal which changes the FF gate output from "ON" to "OFF". When the gate output is "OFF" no further TCKs are input to the die TAPs, forcing them to be idle in the RTI state 4730. From RTI state 4730 the interposer TAP alone can continue to operate through next states (NXS) of the state diagram of FIG. 3A. During subsequent die stack accesses sequences, the die TAPs will start their access from RTI state 4730.

Leaving the die TAPs in the RTI state when they are disconnected from the interposer TAP is advantageous since information they contain before being disconnected, i.e. instruction and data information, is maintained while they are in the RTI state. For example, the information may be information that enables test, debug or monitoring operations in the die while they are disconnected from the interposer TAP. The next time they are connected to the interposer TAP the retained information and the results of any associated test, debug or monitoring operations are immediately available to be accessed via the 1149.1 inputs and output signals of the interposer.

If no further access to the stacked die is required, it may be advantageous to move the die TAPs from the RTI state to the Test Logic Reset (TLR) state of FIG. 3A to force the die TAPs into a forced reset state during functional operation of the die stack.

FIG. 48 illustrates a timing sequence 4800 that can be used to connect die TAPs that have been disconnected in the RTI state to the interposer TAP, then move them from the RTI state to the TLR state. As seen, a die stack access instruction shifted into the instruction register of the interposer TAP and updated in UIR state 4716 as described in the gate "ON" sequence 4702. The interposer TAP is then transitioned to the RTI state for a first 4718 and second time 4720 time to enable TCKs to the die TAPs. The interposer TAP and the enabled die TAPs then transition through the Select-DR (SDR) state 4802 of FIG. 3A, the Select-IR (SIR) state of FIG. 3A to enter the TLR state 4806 of FIG. 3A. The instruction and other circuits of the interposer and die TAPs are reset to safe and known states on the falling TCK edge of the TLR state 4806. As seen, in TLR state 4806, the interposer TAP outputs a reset signal to the FF of gating circuit 4512 on the falling TCK edge to set the gate output of the FF to the "OFF" state, which gates off the TCK input to the die TAPs. With the TCK off, the die TAPs remain in the TLR state 4808, regardless of whether the interposer TAP remains in the TLR state or transitions from the TLR state to other states of FIG. 3A.

If optional gating circuit 4514 of FIG. 45 is used to gate on and off the TMS signal to the TAPs of the die stack, a suitable circuit can be designed to allow gating circuit 4514 to control the TMS signal to provide the above described "ON" 4702, Access 4704 and "OFF" 4706 sequences of FIG. 47 and the "ON" and TLR state entry sequence of FIG. 48.

Figure 49:
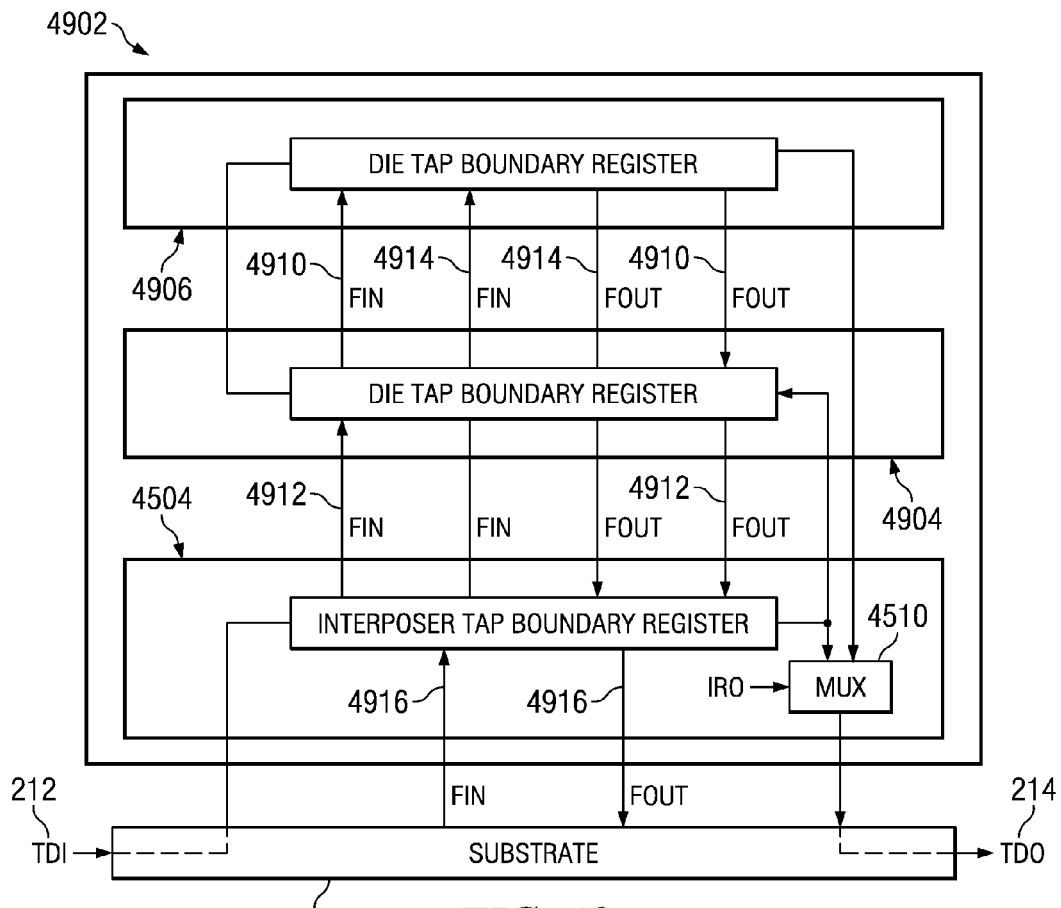
FIG. 49 illustrates the interposer TAP connected in series with die TAPs to enable boundary scan testing.

FIG. 49 illustrates an interposer 4504 of a device 4902 being used to serially connect the interposer TAP boundary register with the TAP boundary registers of two stacked die 4904 and 4906. In this arrangement the 1149.1 input 212 and output 214 bus, illustrated simply as TDI and TDO, of the substrate can be operated to load Extest instructions into the interposer TAP. Once the Extest instructions are loaded the 1149.1 bus can be operated to control the boundary registers to perform interconnect testing between the FIN and FOUT signals 4910 between die 4904 and 4906, between the FIN and FOUT signals 4912 between die 4904 and the interposer 4504, between the FIN and FOUT signals 4914 between die 4906 and the interposer 4504 and between the FIN and FOUT signals 4916 and between the interposer 4504 and substrate 4908. Again while only two stacked die are shown, any number may exist in the stack.

Figure 50:
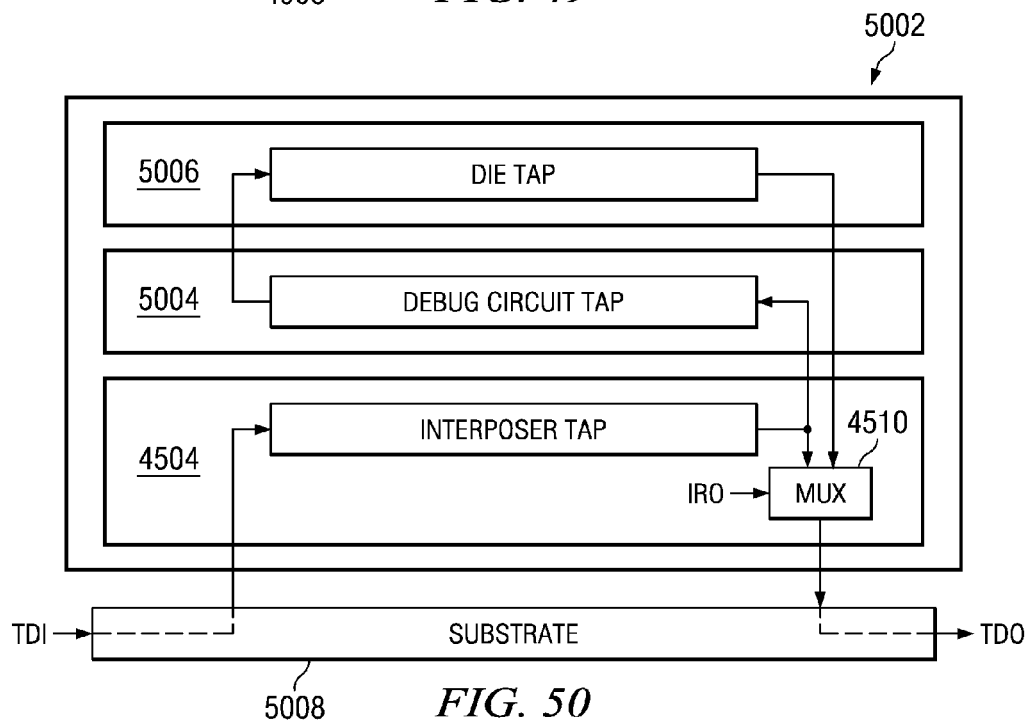
FIG. 50 illustrates the interposer TAP connected in series with die TAPs to provide access to die resident debug circuitry.

FIG. 50 illustrates an interposer 4504 of a device 5002 being used to serially connect the interposer TAP with TAPs of die 5004 and 5006. In this arrangement the 1149.1 input 212 and output 214 bus, illustrated simply as TDI and TDO, of substrate 5008 can be operated to allow access of the TAP of die 5004 that controls Debug circuitry in die 5004. During access of the Debug circuit TAP of die 5004, the TAPs of the interposer and die 5006 may advantageously be loaded with the Bypass instruction to shorten the TDI to TDO data path length through the interposer and die 5006 to only a single bit each.

Figure 51:
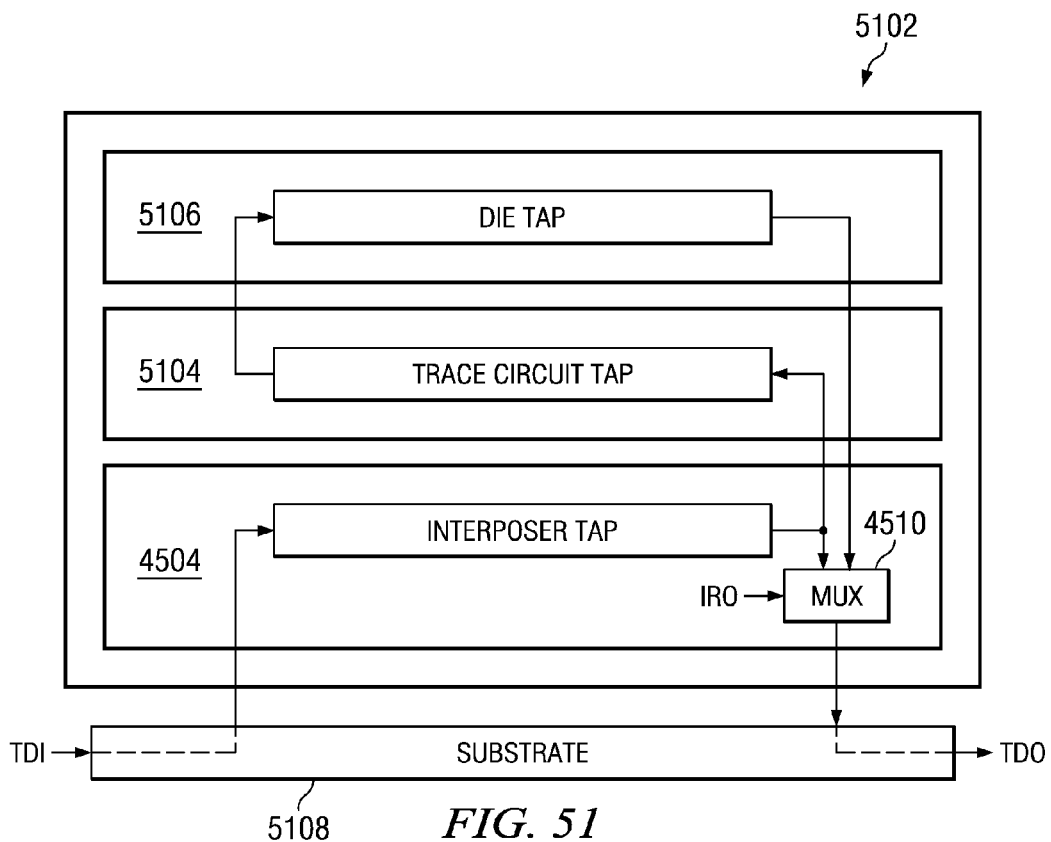
FIG. 51 illustrates the interposer TAP connected in series with die TAPs to provide access to die resident trace circuitry.

FIG. 51 illustrates an interposer 4504 of a device 5102 being used to serially connect the interposer TAP with TAPs of die 5104 and 5106. In this arrangement the 1149.1 input 212 and output 214 bus, illustrated simply as TDI and TDO, of substrate 5108 can be operated to allow access of the TAP of die 5004 that controls Trace circuitry in die 5104. During access of the Trace circuit TAP of die 5104, the TAPs of the interposer and die 5106 may advantageously be loaded with the Bypass instruction to shorten the TDI to TDO data path length through the interposer and die 5106 to only a single bit each.

Figure 52:
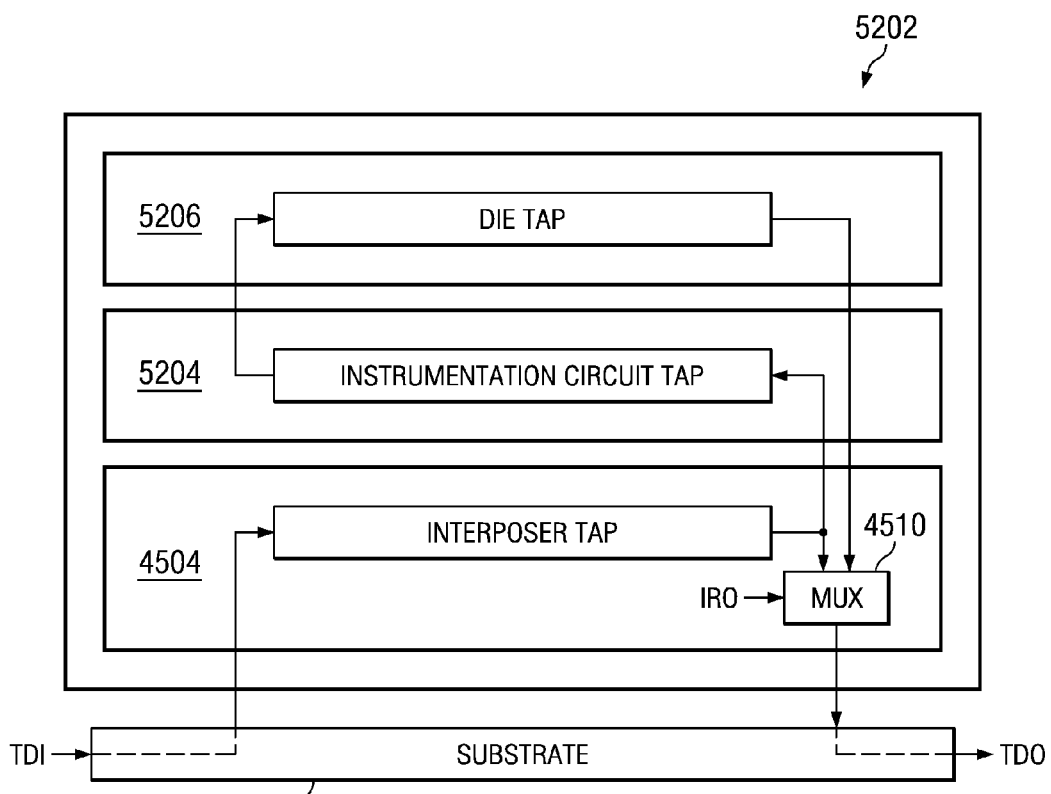
FIG. 52 illustrates the interposer TAP connected in series with die TAPs to provide access to die resident instrumentation circuitry.

FIG. 52 illustrates an interposer 4504 of a device 5202 being used to serially connect the interposer TAP with TAPs of die 5204 and 5206. In this arrangement the 1149.1 input 212 and output 214 bus, illustrated simply as TDI and TDO, of substrate 5208 can be operated to allow access of the TAP of die 5204 that controls Instrumentation circuitry in die 5204. During access of the Instrumentation circuit TAP of die 5204, the TAPs of the interposer and die 5206 may advantageously be loaded with the Bypass instruction to shorten the TDI to TDO data path length through the interposer and die 5206 to only a single bit each.

Figure 53:
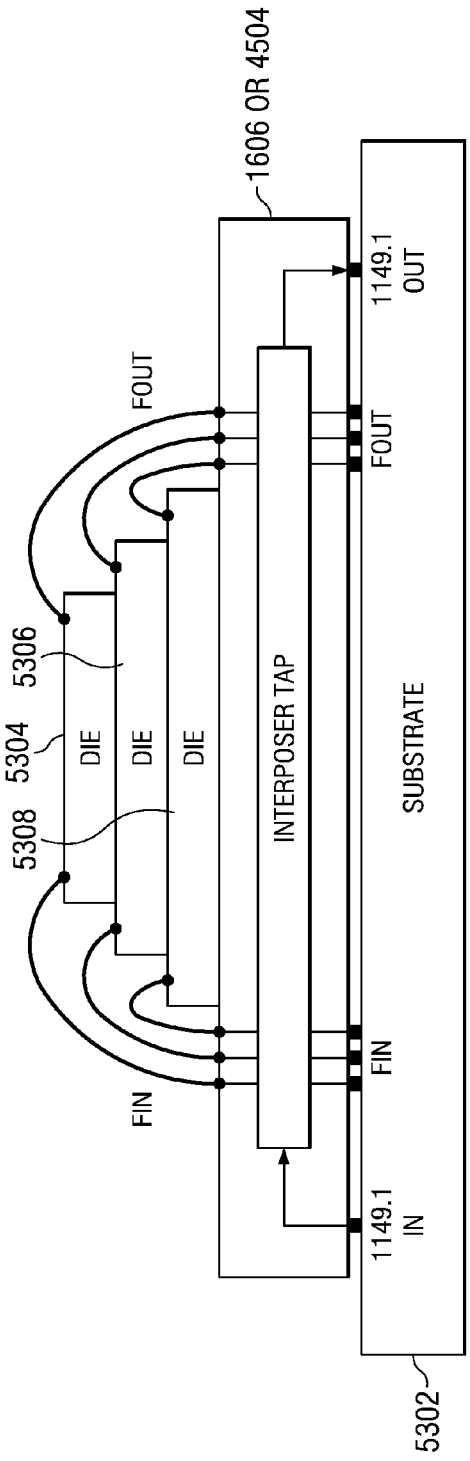
FIG. 53 illustrates stacked die wire bonded to the interposer of the disclosure.

FIG. 53 illustrates the use of an 1149.1 interposer 1606 or 4504 with a stack of die 5304-5306 that are connected to the interposer via bond wires. The interposer 1606 or 4504 operates as previously described to test the interconnectivity between the FIN and FOUT signals of the die stack and a substrate. The interposer can also access TAPs within the stacked die as previously described in regard to interposer 4504.

Figure 54:
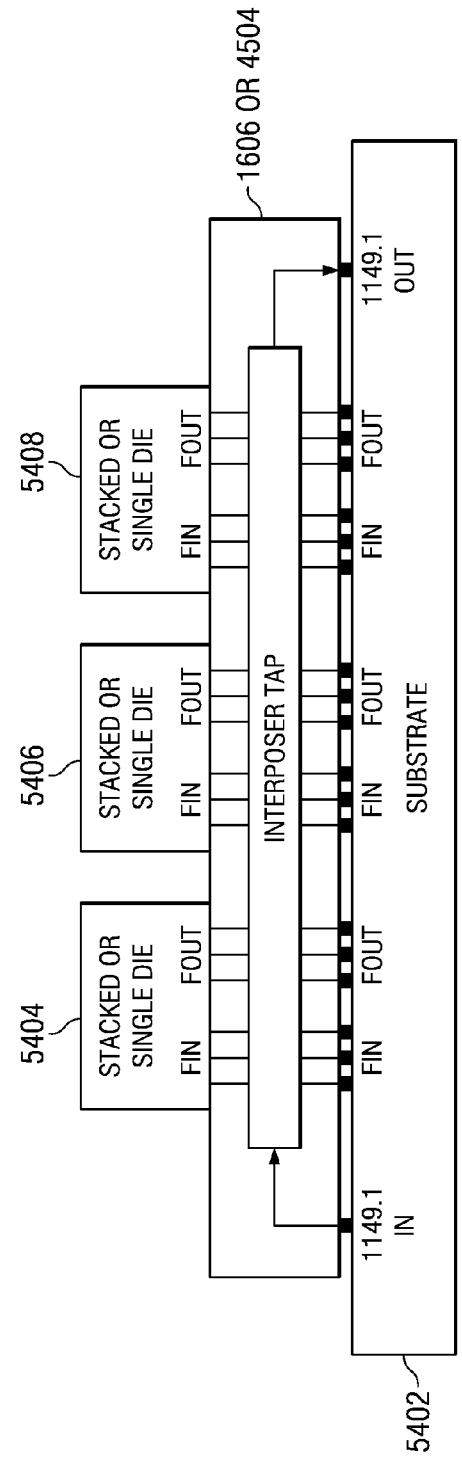
FIG. 54 illustrates multiple single or stacked die devices mounted to the interposer of the disclosure.

FIG. 54 illustrates a group of stacked or single die 5404-5406 located on an 1149.1 interposer 1606 or 4504. The interposer 1606 or 4504 operates as previously described to test the interconnectivity between the FIN and FOUT signal of the group of stacked or single die stack and a substrate. The interposer can also access TAPs within the group of stacked or single die as previously described in regard to interposer 4504.

FIG. 55A-55E illustrates a simplified view of the arrangement of FIG. 54 showing only the 1149.1 bussing path and the TAPs 204 of the interposer 4504 and stacked or single die 5404-5408. A multiplexer 5502 in the interposer 4504 allows for selecting different TAP combinations using interposer TAP instructions as described in multiplexer 4510 FIG. 45-52. The only difference between multiplexer 4510 and multiplexer 5502 is that multiplexer 5502 has more inputs for selecting the TDO from different the TAPs to be output on the interposer TDO.

Figure 55A:
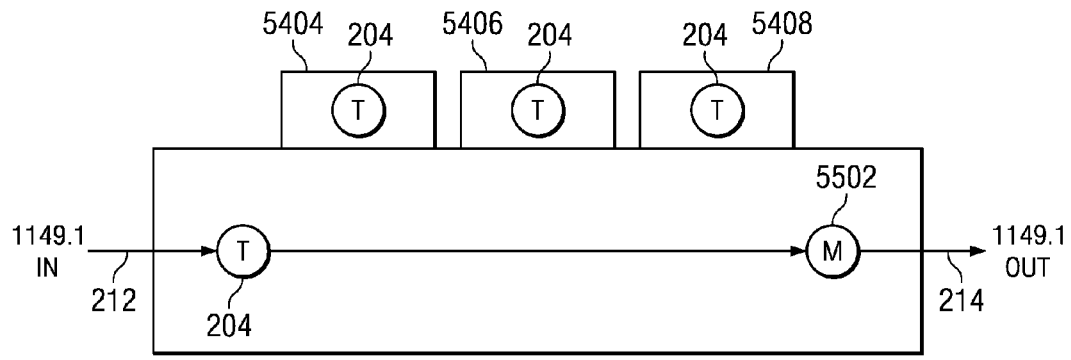
FIGS. 55A-55E illustrate different scan path arrangements through the interposer of the disclosure.

In FIG. 55A, an instruction is loaded into the interposers TAP to control multiplexer 5502 to allow data to be scanned through the interposer's TAP via the interposer's 1149.1 input 212 and output 214 signals.

Figure 55B:
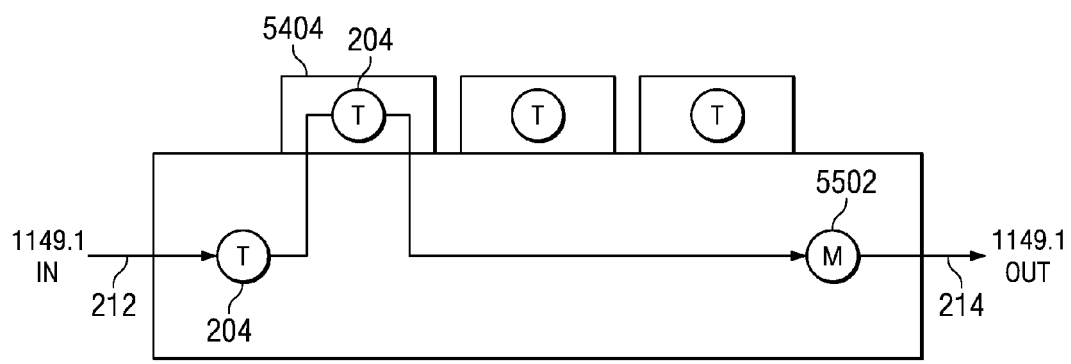

In FIG. 55B, an instruction is loaded into the interposers TAP to control multiplexer 5502 to allow data to be scanned through the interposer's TAP and die 5404 TAP via the interposer's 1149.1 input 212 and output 214 signals.

Figure 55C:
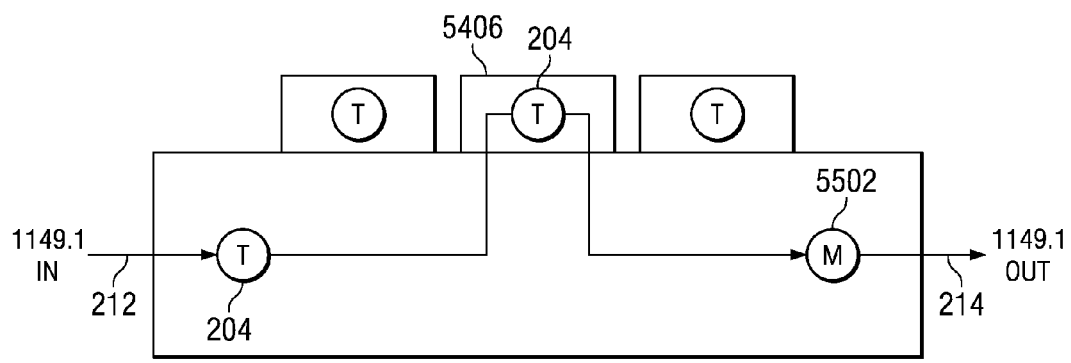

In FIG. 55C, an instruction is loaded into the interposers TAP to control multiplexer 5502 to allow data to be scanned through the interposer's TAP and die 5406 TAP via the interposer's 1149.1 input 212 and output 214 signals.

Figure 55D:
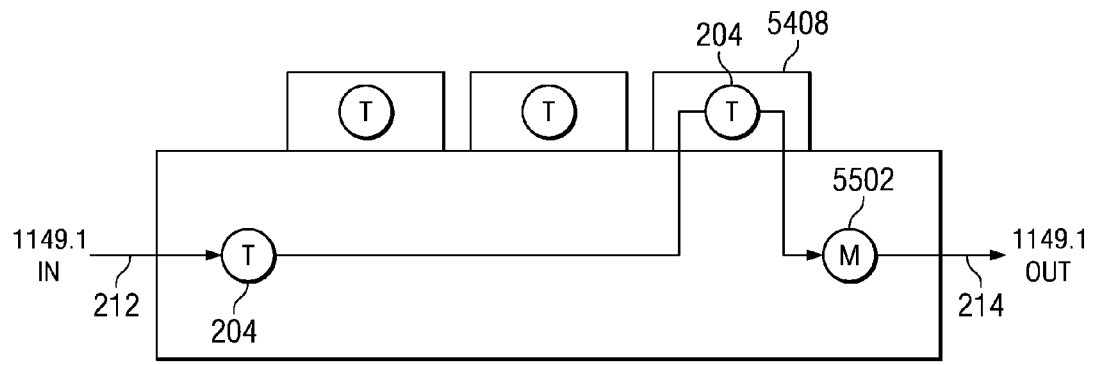

In FIG. 55D, an instruction is loaded into the interposers TAP to control multiplexer 5502 to allow data to be scanned through the interposer's TAP and die 5408 TAP via the interposer's 1149.1 input 212 and output 214 signals.

Figure 55E:
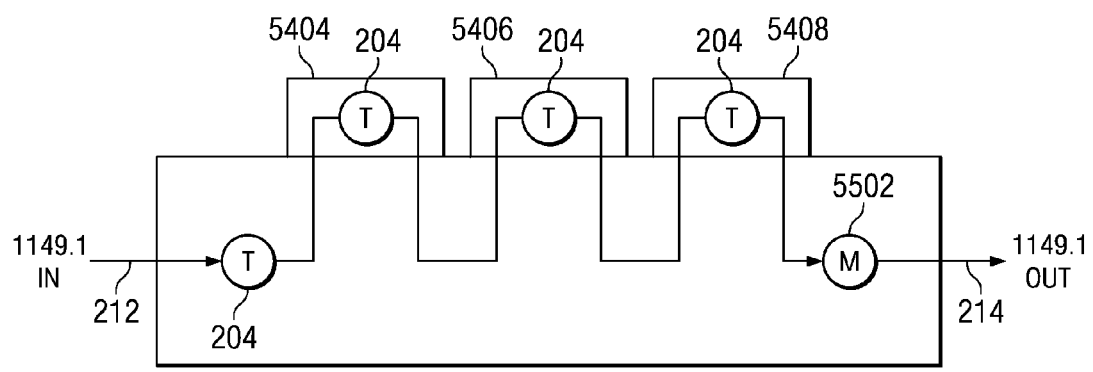

In FIG. 55E, an instruction is loaded into the interposers TAP to control multiplexer 5502 to allow data to be scanned through the interposer's TAP and the TAPs of die 5404-5408 via the interposer's 1149.1 input 212 and output 214 signals.

Although the disclosure has been described in detail, it should be understood that various changes, substitutions and alterations may be made without departing from the spirit and scope of the disclosure as defined by the appended claims.

What is claimed is:

1. An integrated circuit interposer comprising:
   A. a substrate having a first side and an opposed second side;
   B. first functional input pads formed on the first side of the substrate;
   C. first functional output pads formed on the second side of the substrate and coupled to the first functional input pads;
   D. second functional input pads formed on the second side of the substrate;
   E. second functional output pads formed on the first side of the substrate and coupled to the second functional input pads;
   F. a test data input pad, a test clock input pad, a test mode select input pad, and a test data output pad formed on the first side of the substrate;
   G. a test access port controller, formed on the substrate, coupled to the test clock input pad and the test mode select input pad, and having a control output bus; and
   H. boundary register circuitry, formed on the substrate, having a control input connected to the control output bus of the test access port controller, and the boundary register circuitry selectively coupling the first functional input pads to the first functional output pads and selectively coupling the second functional input pads to the second functional output pads.

2. The integrated circuit interposer of claim 1 and a base substrate carrying the integrated circuit interposer, the base substrate having pads connected to the pads on the first side of the integrated circuit interposer substrate.

3. The integrated circuit interposer of claim 1 and stacked integrated circuit die, carrying functional integrated circuits, coupled to the pads on the second side of the integrated circuit interposer substrate.

* * * * *